US010072867B2

(12) United States Patent
Isono et al.

(10) Patent No.: US 10,072,867 B2
(45) Date of Patent: Sep. 11, 2018

(54) AIR-CONDITIONING CONTROL SYSTEM USING SOUND WAVES

(71) Applicant: DENSO WAVE INCORPORATED, Chita-gun, Aichi-pref (JP)

(72) Inventors: Taku Isono, Chita-gun (JP); Takahiro Miyajima, Nagoya (JP)

(73) Assignee: DENSO WAVE INCORPORATED, Aichi-Pref. (JP)

( * ) Notice: Subject to any disclaimer, the term of this patent is extended or adjusted under 35 U.S.C. 154(b) by 169 days.

(21) Appl. No.: 14/610,390

(22) Filed: Jan. 30, 2015

(65) Prior Publication Data
US 2015/0219353 A1    Aug. 6, 2015

(30) Foreign Application Priority Data

Jan. 31, 2014 (JP) .................................. 2014-017136

(51) Int. Cl.
*F24F 11/00* (2018.01)
*F24F 11/62* (2018.01)
(Continued)

(52) U.S. Cl.
CPC .............. *F24F 11/62* (2018.01); *F24F 11/30* (2018.01); *F24F 11/46* (2018.01); *F24F 11/54* (2018.01); *F24F 11/56* (2018.01)

(58) Field of Classification Search
CPC .... F24F 11/001; F24F 11/006; F24F 11/0034; F24F 2011/0053; F24F 2011/0063;
(Continued)

(56) References Cited

U.S. PATENT DOCUMENTS 4,223,831 A * 9/1980 Szarka ............... G05D 23/1902
165/257
5,833,134 A * 11/1998 Ho ....................... F24F 11/0076
236/49.3
(Continued)

FOREIGN PATENT DOCUMENTS

JP    H11294839 A    10/1999
JP    5382169 B1 *   1/2014 ............ F24F 11/006

OTHER PUBLICATIONS

Jun. 20, 2018 Office Action Issued in U.S. Appl. No. 14/610,675.

*Primary Examiner* — Travis Ruby
(74) *Attorney, Agent, or Firm* — Oliff PLC

(57) ABSTRACT

An air-conditioning control system, which controls a central-type air-conditioning system, includes a plurality of auxiliary controllers respectively set in a plurality of areas and a main controller capable of communicating with each auxiliary controller. Each auxiliary controller includes a sound wave receiving unit, which receive sound waves that are outputted from a portable apparatus capable of outputting sound waves, and a sound wave strength information transmitting unit which transmits, to the main controller, sound wave strength information indicating sound wave reception strength. By the main controller, a first operating mode is set for at least a single area in which the auxiliary controller of a transmission source for specific sound wave strength information, which indicates a sound wave strength that is a predetermined threshold or higher is set, and a second operating mode is set for at least one of the remaining areas.

11 Claims, 18 Drawing Sheets

(51) Int. Cl.
*F24F 11/30* (2018.01)
*F24F 11/54* (2018.01)
*F24F 11/56* (2018.01)
*F24F 11/46* (2018.01)

(58) Field of Classification Search
CPC ....... F24F 2011/0064; F24F 2011/0065; F24F 2011/0067; F24F 2011/0068; F24F 2011/0075; F24F 11/0086
USPC .......................................... 236/1 B; 165/237
See application file for complete search history.

(56) References Cited

U.S. PATENT DOCUMENTS

| | | | |
|---|---|---|---|
| 2013/0140016 A1* | 6/2013 | Storm | F24F 11/006 165/205 |
| 2013/0245837 A1* | 9/2013 | Grohman | G05B 15/02 700/276 |
| 2013/0336292 A1 | 12/2013 | Kore et al. | |
| 2015/0142176 A1* | 5/2015 | Senba | F24F 11/006 700/275 |
| 2015/0219354 A1 | 8/2015 | Isono et al. | |

* cited by examiner

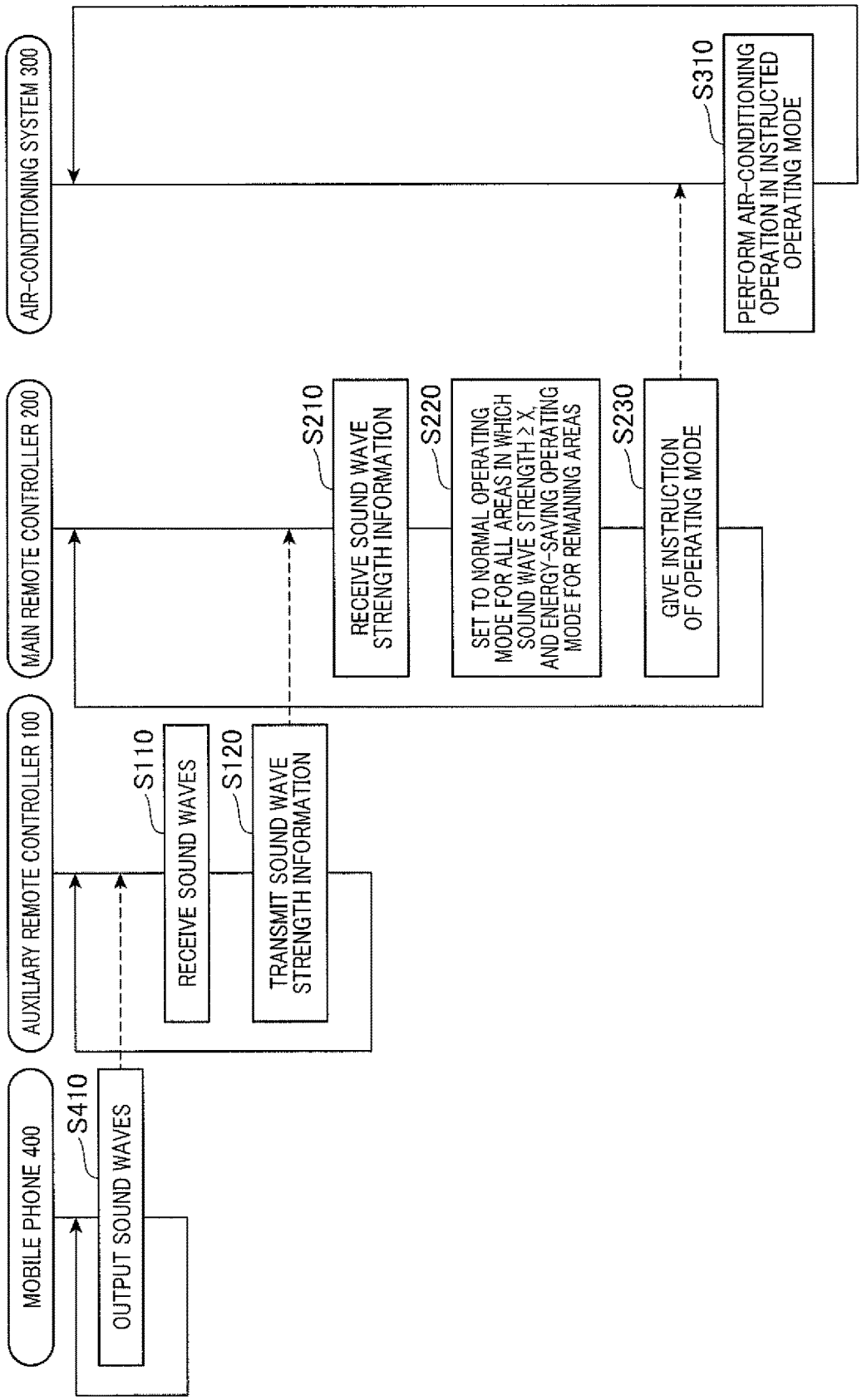

AREAS A AND B: NORMAL OPERATING MODE
AREAS C AND D: ENERGY-SAVING OPERATING MODE

FIG.9

| No. | SOUND WAVE RECEPTION STATE | OPERATING MODE | SCHEMATIC DIAGRAM |
|---|---|---|---|
| 1 | · PLURALITY OF AUXILIARY REMOTE CONTROLLERS 100 RECEIVE SOUND WAVES HAVING STRENGTH OF X OR HIGHER | · ALL AREAS RECEIVING SOUND WAVES HAVING STRENGTH OF X OR HIGHER : NORMAL OPERATING MODE | |
| 2 | · SINGLE AUXILIARY REMOTE CONTROLLER 100 RECEIVES SOUND WAVES HAVING STRENGTH OF X OR HIGHER<br><br>· REMAINING AUXILIARY REMOTE CONTROLLERS 100 RECEIVE SOUND WAVES HAVING STRENGTH LOWER THAN X | · AREA RECEIVING SOUND WAVES HAVING STRENGTH OF X OR HIGHER: NORMAL OPERATING MODE<br><br>· AREAS RECEIVING SOUND WAVES HAVING STRENGTH LOWER THAN X : ENERGY-SAVING OPERATING MODE | |
| 3 | · SINGLE AUXILIARY REMOTE CONTROLLER 100 RECEIVES SOUND WAVES HAVING STRENGTH OF X OR HIGHER<br><br>· REMAINING AUXILIARY REMOTE CONTROLLERS 100 DO NOT RECEIVE SOUND WAVES | · AREA RECEIVING SOUND WAVES HAVING STRENGTH OF X OR HIGHER : NORMAL OPERATING MODE<br><br>· AREAS NOT RECEIVING SOUND WAVES : ENERGY-SAVING OPERATING MODE | |
| 4 | · PLURALITY OF AUXILIARY REMOTE CONTROLLERS 100 RECEIVE SOUND WAVES HAVING STRENGTH LOWER THAN X | · ALL AREAS RECEIVING SOUND WAVES HAVING STRENGTH LOWER THAN X : ENERGY-SAVING OPERATING MODE | |
| 5 | · SINGLE AUXILIARY REMOTE CONTROLLER 100 RECEIVES SOUND WAVES HAVING STRENGTH LOWER THAN X<br><br>· REMAINING AUXILIARY REMOTE CONTROLLERS 100 DO NOT RECEIVE SOUND WAVES | · AREA RECEIVING SOUND WAVES HAVING STRENGTH LOWER THAN X : ENERGY-SAVING OPERATING MODE<br><br>· AREAS NOT RECEIVING SOUND WAVES : ENERGY-SAVING OPERATING MODE | |
| 6 | · NONE OF AUXILIARY REMOTE CONTROLLERS 100 RECEIVE SOUND WAVES | · ALL AREA NOT RECEIVING SOUND WAVES : ENERGY-SAVING OPERATING MODE | |

AREA B: NORMAL OPERATING MODE
AREAS A, C, AND D: ENERGY-SAVING OPERATING MODE

AREA A: NORMAL OPERATING MODE
AREAS B, C, AND D: ENERGY-SAVING OPERATING MODE

AREA A: NORMAL OPERATING MODE
AREAS B, C, AND D: ENERGY-SAVING OPERATING MODE

FIG.14

| No. | SOUND WAVE RECEPTION STATE | OPERATING MODE | SCHEMATIC DIAGRAM |
|---|---|---|---|
| 1 | · PLURALITY OF AUXILIARY REMOTE CONTROLLERS 100 RECEIVE SOUND WAVES HAVING STRENGTH OF X OR HIGHER | · AREA RECEIVING SOUND WAVE HAVING HIGHEST STRENGTH AMONG AREAS RECEIVING SOUND WAVES HAVING STRENGTH OF X OR HIGHER : NORMAL OPERATING MODE<br><br>· REMAINING AREAS : ENERGY-SAVING OPERATING MODE | 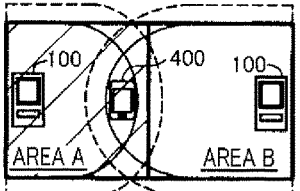 |
| 2 | · SINGLE AUXILIARY REMOTE CONTROLLER 100 RECEIVES SOUND WAVES HAVING STRENGTH OF X OR HIGHER<br><br>· REMAINING AUXILIARY REMOTE CONTROLLERS 100 RECEIVE SOUND WAVES HAVING STRENGTH LOWER THAN X | · AREA RECEIVING SOUND WAVES HAVING STRENGTH OF X OR HIGHER: NORMAL OPERATING MODE<br><br>· AREAS RECEIVING SOUND WAVES HAVING STRENGTH LOWER THAN X : ENERGY-SAVING OPERATING MODE | 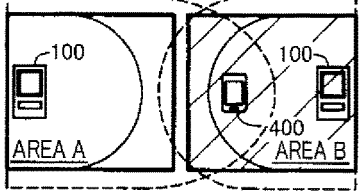 |
| 3 | · SINGLE AUXILIARY REMOTE CONTROLLER 100 RECEIVES SOUND WAVES HAVING STRENGTH OF X OR HIGHER<br><br>· REMAINING AUXILIARY REMOTE CONTROLLERS 100 DO NOT RECEIVE SOUND WAVES | · AREA RECEIVING SOUND WAVES HAVING STRENGTH OF X OR HIGHER : NORMAL OPERATING MODE<br><br>· AREAS NOT RECEIVING SOUND WAVES : ENERGY-SAVING OPERATING MODE | 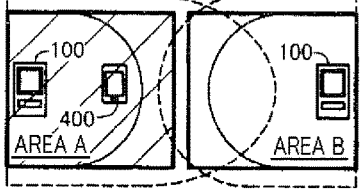 |
| 4 | · PLURALITY OF AUXILIARY REMOTE CONTROLLERS 100 RECEIVE SOUND WAVES HAVING STRENGTH LOWER THAN X | · ALL AREAS RECEIVING SOUND WAVES HAVING STRENGTH LOWER THAN X : ENERGY-SAVING OPERATING MODE | 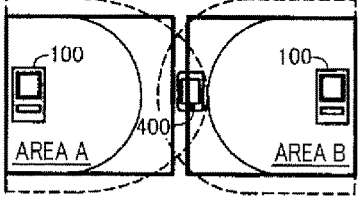 |
| 5 | · SINGLE AUXILIARY REMOTE CONTROLLER 100 RECEIVES SOUND WAVES HAVING STRENGTH LOWER THAN X<br><br>· REMAINING AUXILIARY REMOTE CONTROLLERS 100 DO NOT RECEIVE SOUND WAVES | · AREA RECEIVING SOUND WAVES HAVING STRENGTH LOWER THAN X : ENERGY-SAVING OPERATING MODE<br><br>· AREAS NOT RECEIVING SOUND WAVES : ENERGY-SAVING OPERATING MODE | 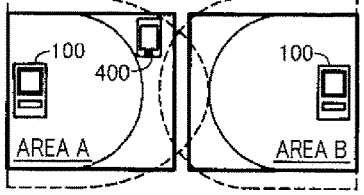 |
| 6 | · NONE OF AUXILIARY REMOTE CONTROLLERS 100 RECEIVE SOUND WAVES | · ALL AREA NOT RECEIVING SOUND WAVES : ENERGY-SAVING OPERATING MODE | 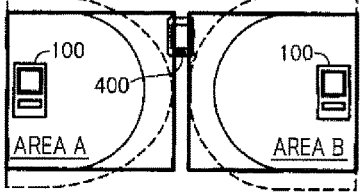 |

CONDITION A: WHEN NUMBER OF AREAS HAVING SOUND WAVE STRENGTH HIGHER THAN THRESHOLD X HAS BEEN LARGER THAN 1
CONDITION B: WHEN NUMBER OF AREAS HAVING SOUND WAVE STRENGTH HIGHER THAN THRESHOLD X HAS BEEN EQUAL TO OR SMALLER THAN 1

FIG.17
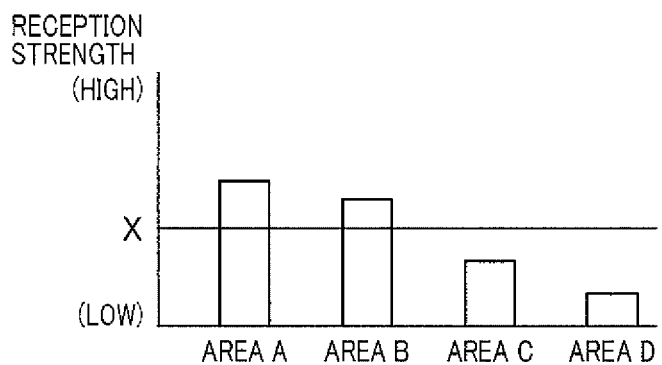
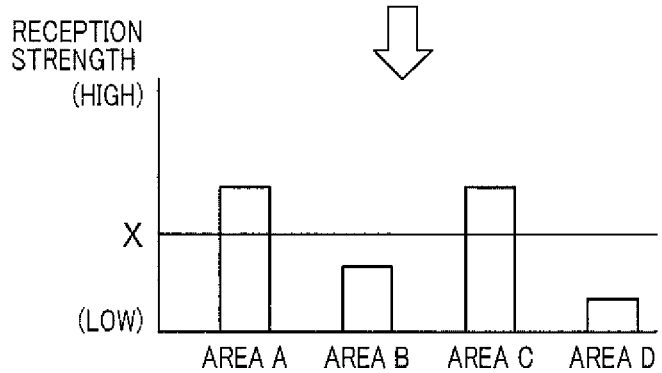
IN AREA UNDETERMINED STATE, EVEN WHEN CHANGE SHOWN ABOVE OCCURS, AREA A CONTINUES TO BE DETERMINED AS AIR-CONDITIONING-ON AREA

AIR-CONDITIONING CONTROL SYSTEM USING SOUND WAVES

CROSS-REFERENCE TO RELATED APPLICATION

This application is based on and claims the benefit of priority from Japanese Patent Application No. 2014-017136, filed Jan. 31, 2014, the disclosure of which is incorporated herein in its entirety by reference.

BACKGROUND

Technical Field

The present invention relates to an air-conditioning control system.

Related Art

A central-type air-conditioning system is known that uses a single air-conditioning unit to condition a plurality of rooms in a building. In the central-type air-conditioning system, the air-conditioning unit is connected by ducts to blower units that are provided in each room. Cool air or warm air generated by the air-conditioning unit is supplied to the blower unit in each room via the ducts.

In the central-type air-conditioning system, each room is conditioned at all times, regardless of whether or not a person is present in the room. To reduce energy consumption by the central-type air-conditioning system, the following has been proposed (refer to JP-A-H11-294839). For example, a human detecting sensor is provided in each room. The human detecting sensor uses infrared radiation or the like to detect whether or not a person is present. When the human detecting sensor determines that a person is present in a room, operating mode for the room is set to normal operating mode. In normal operating mode, the room is conditioned so as to bring the room temperature closer to a target temperature. When the human detecting sensor determines that a person is not present in a room, the operating mode for the room is set to energy-saving operating mode. In energy-saving operating mode, the room is conditioned so as to bring the room temperature closer to a post-adjustment target temperature. The post-adjustment target temperature is set to a temperature that is more uncomfortable than the target temperature.

In the above-described technology, a human detecting sensor is required to be set in each room. Therefore, a problem occurs in that system configuration becomes complex. Cost also increases. In addition, a problem occurs in that the human detecting sensor may make an erroneous determination regarding the presence of a person, depending on the position of the person inside the room. Energy consumption may not be effectively reduced. Conversely, the comfort of air-conditioning may be compromised. Such problems are common problems in the control of central-type air-conditioning systems. These central-type air-conditioning systems are not limited to those that condition each of a plurality of rooms inside a building, but also include those that condition each of a plurality of areas of which at least a portion of the boundaries is partitioned by an object.

SUMMARY

It is thus desired to provide a technology that is capable of effectively reducing energy consumption by a central-type air-conditioning system without compromising the comfort of air-conditioning, while preventing complexity in system configuration.

(1) A first exemplary embodiment of the present disclosure provides an air-conditioning control system that controls a central-type air-conditioning system. The central-type air-conditioning system is capable of performing conditioning in a first operating mode and conditioning in a second operating mode, for each of a plurality of areas of which at least a portion of the boundaries is partitioned by an object. The second operating mode has lower energy consumption than the first operating mode.

The air-conditioning control system includes a plurality of auxiliary controllers and a main controller. The plurality of auxiliary controllers are respectively set in the plurality of areas. The main controller is capable of communicating with each of the plurality of auxiliary controllers.

The plurality of auxiliary controllers each include a sound wave receiving unit and a sound wave strength information transmitting unit. The sound wave receiving unit receives sound waves that are outputted from a portable apparatus that is capable of outputting sound waves. The sound wave strength information transmitting unit transmits sound wave strength information to the main controller. The sound wave strength information indicates sound wave reception strength.

The main controller includes a storage unit and an operating mode setting unit. The storage unit stores therein a predetermined threshold. The operating mode setting unit sets the operating mode to the first operating mode for at least a single area in which the auxiliary controller that is a transmission source for specific sound wave strength information is set. The specific sound wave strength information indicates a sound wave strength that is the threshold or higher. The operating mode setting unit sets the operating mode to the second operating mode for at least one of the remaining areas.

In this air-conditioning control system, an air-conditioning operating mode setting that takes into consideration whether or not a person is present in each area can be actualized without a human detecting sensor being set in each area. In addition, the sound wave reception strength at the auxiliary controller set in an area can be expected to be a certain level or higher, as long as the portable apparatus that outputs the sound waves is positioned inside this area.

Furthermore, sound waves have the following properties. That is, in comparison to radio waves, sound waves are easily obstructed by objects, and do not easily travel around and behind objects. In addition, sound waves tend to attenuate while passing through air. Therefore, for example, when an object is present between the portable apparatus and the auxiliary controller, such as in the case of an auxiliary controller that is positioned in an area adjacent to the area in which the portable apparatus that outputs the sound waves is positioned, the sound wave reception strength at the auxiliary controller is expected to be extremely low. Therefore, whether or not the portable apparatus (person holding the portable apparatus) is present in each area can be accurately determined.

As a result, in this air-conditioning control system, energy consumption by the central-type air-conditioning system can be effectively reduced without compromising the comfort of air-conditioning, while preventing complexity in system configuration.

(2) In the above-described air-conditioning control system, the operating mode setting unit may set the operating mode to the first operating mode for all areas in which the auxiliary controller that is the transmission source of the specific sound wave strength information is set. The operating mode setting unit may set the operating mode to the second operating mode for the remaining areas.

In this air-conditioning control system, when the sound wave strength that is the threshold or higher is received in a plurality of areas, the operating mode is set to the first operating mode for all of these areas. Therefore, air-conditioning operation performed after the area in which the sound wave strength that is the threshold or higher is received subsequently becomes a single area can be smoothly performed. The comfort of air-conditioning can be improved.

(3) In the above-described air-conditioning control system, the plurality of auxiliary controllers may each repeatedly perform reception of the sound waves by the sound wave receiving unit and transmission of the sound wave strength information to the main controller by the sound wave strength information transmitting unit, at a common timing. The operating mode setting unit may repeatedly perform setting of the air-conditioning operating mode for each of the plurality of areas. In this air-conditioning control system, even when the portable apparatus moves, the air-conditioning operating mode of each area can be set to an optimal mode based on the position of the portable apparatus.

(4) In the above-described air-conditioning control system, the plurality of auxiliary controllers may each further include a storage unit that stores therein an area identifier (ID). The area ID identifies the area in which the auxiliary controller is set. The sound wave strength information transmitting unit may transmit the sound wave strength information, together with the area ID, to the main controller. In this air-conditioning system, the main controller can appropriately set the air-conditioning operating mode for each area. The air-conditioning system can be instructed to perform conditioning in the mode set for each area.

(5) In the above-described air-conditioning control system, the portable apparatus may be a mobile phone. In the air-conditioning control system according to this aspect, whether or not the mobile phone (person holding the mobile phone) is present in each area can be accurately determined using sound waves outputted from the mobile phone that is widely available to the general public. Energy consumption by the central-type air-conditioning system can be effectively reduced without compromising the comfort of air-conditioning, while preventing complexity in system configuration.

(6) A second exemplary embodiment of the present disclosure provides an air-conditioning control system that controls a central-type air-conditioning system. The central-type air conditioning system is capable of performing conditioning in a first operating mode and conditioning in a second operating mode, for each of a plurality of areas of which at least a portion of the boundaries is partitioned by an object. The second operating mode has lower energy consumption than the first operating mode.

The air-conditioning control system includes a plurality of auxiliary controllers and a main controller. The plurality of auxiliary controllers are respectively set in the plurality of areas. The main controller is capable of communicating with each of the plurality of auxiliary controllers.

The plurality of auxiliary controllers each include a sound wave receiving unit and a sound wave strength information transmitting unit. The sound wave receiving unit receives sound waves that are outputted from an apparatus that is carried on a person. The sound wave strength information transmitting unit transmits sound wave strength information to the main controller. The sound wave strength information indicates sound wave reception strength.

The main controller includes a storage unit and an operating mode setting unit. The storage unit stores therein a predetermined threshold. The operating mode setting unit sets the operating mode to the first operating mode for at least a single area in which the auxiliary controller that is a transmission source for specific sound wave strength information is set. The specific sound wave strength information indicates a sound wave strength that is the threshold or higher. The operating mode setting unit sets the operating mode to the second operating mode for at least one of the remaining areas.

In this air-conditioning control system, air-conditioning operating mode setting that takes into consideration whether or not a person is present in each area can be actualized without a human detecting sensor being set in each area. In addition, the sound wave reception strength at the auxiliary controller set in an area can be expected to be a certain level or higher, as long as the apparatus that outputs the sound waves is positioned inside this area.

Furthermore, sound waves have the following properties. That is, in comparison to radio waves, sound waves are easily obstructed by objects, and do not easily travel around and behind objects. In addition, sound waves tend to attenuate while passing through air. Therefore, for example, when an object is present between the portable apparatus and the auxiliary controller, such as in the case of an auxiliary controller that is set in an area adjacent to the area in which the apparatus that outputs the sound waves is positioned, the sound wave reception strength at the auxiliary controller is expected to be extremely low. Therefore, whether or not the apparatus (person holding the apparatus) is present in each area can be accurately determined.

As a result, in this air-conditioning control system, energy consumption by the central-type air-conditioning system can be effectively reduced without compromising the comfort of air-conditioning, while preventing complexity in system configuration.

Not all of the constituent elements included in each of the above-described exemplary embodiments are essential. Some constituent elements among the constituent elements may be modified, omitted, exchanged with other new constituent elements, or be modified to remove some limitations as appropriate to solve some or all of the above-described problems or to achieve some or all of the effects described in the present specification.

In addition, some or all of the technical features included in each of the above-described exemplary embodiments may be combined with some or all of the technical features included in another exemplary embodiment of the present disclosure, thereby forming a separate aspect of the present disclosure, to solve some or all of the above-described problems or to achieve some or all of the effects described in the present specification.

The present disclosure can be actualized by various exemplary embodiments other than the air-conditioning control system, for example, an air-conditioning control apparatus (device) and an air-conditioning control method.

BRIEF DESCRIPTION OF THE DRAWINGS

In the accompanying drawings:

FIG. 5 is a sequence diagram of the flow of an air-conditioning control process according to the first embodiment;

FIG. 9 is an explanatory diagram summarizing a relationship between the sound wave reception state in the auxiliary remote controller and the operating mode set for each area according to the first embodiment;

FIG. 14 is an explanatory summarizing a relationship between the sound wave reception state in the auxiliary remote controller and the operating mode set for each area according to the second embodiment;

FIG. 17 is an explanatory diagram of an example of means for changing the air-conditioning-on area according to the sixth variation example.

DESCRIPTION OF EMBODIMENTS

A. First Embodiment

A-1. System Configuration

Figure 1:
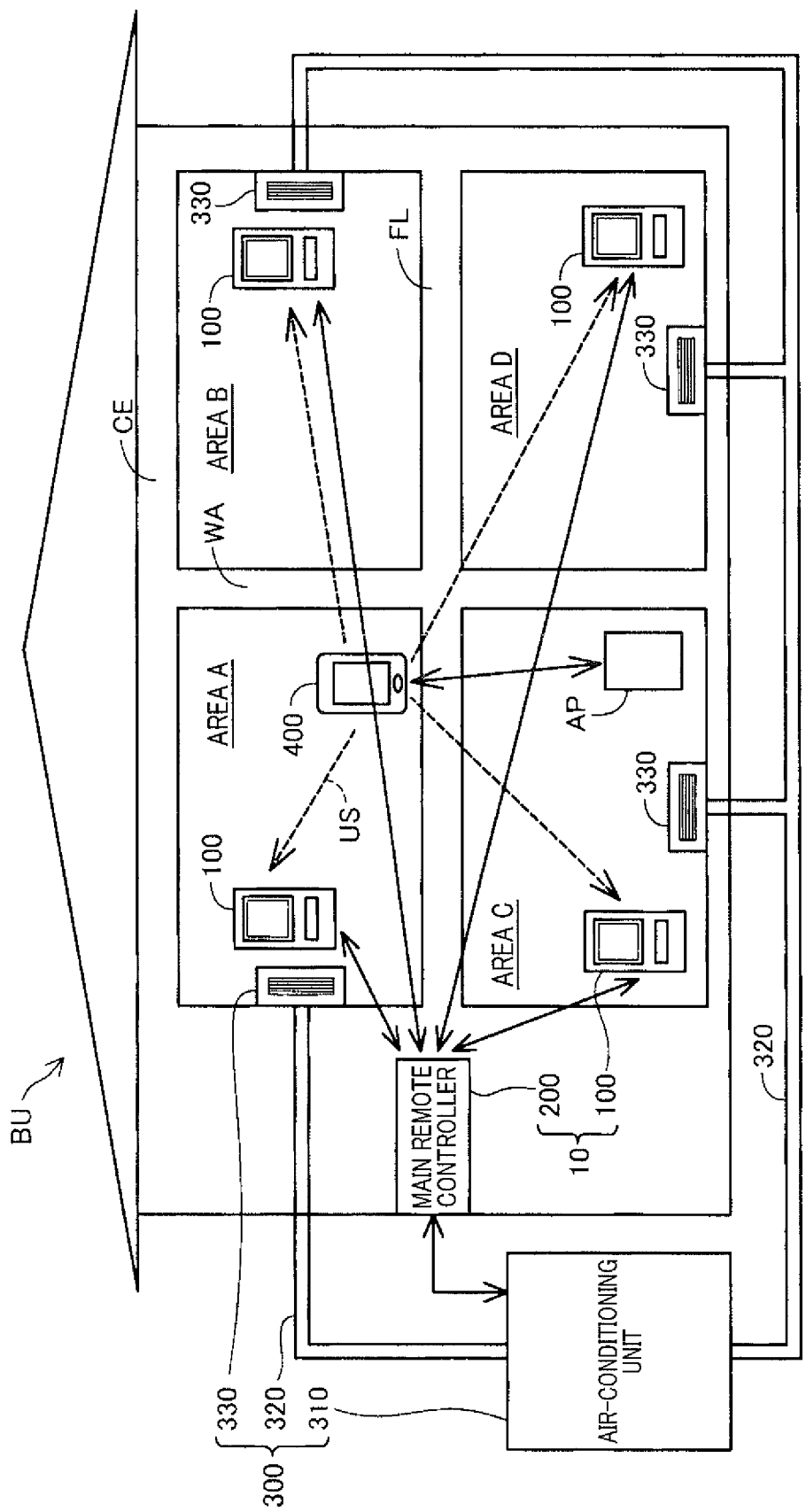
FIG. 1 is an explanatory diagram of a configuration of an air-conditioning control system according to a first embodiment of the present disclosure.

FIG. 1 is an explanatory diagram of a configuration of an air-conditioning control system 10 according to a first embodiment of the present disclosure. The air-conditioning control system 10 controls an air-conditioning system 300 that performs air-conditioning (also referred to, hereinafter, as simply "conditioning") of a plurality of areas inside a building BU. FIG. 1 shows four areas (areas A, B, C, and D) inside the building BU that are subjected to conditioning by the air-conditioning system 300. Each area is a room of which the boundaries are partitioned by walls WA, a floor FL, and a ceiling CE.

The air-conditioning system 300 is a so-called central-type air-conditioning system. The air-conditioning system 300 has an air-conditioning unit 310, blower units 330, and ducts 320. The air-conditioning unit 310 is set outside of the building BU. The blower units 330 are provided in each area. The ducts 320 connect the air-conditioning unit 310 to each blower unit 330.

The air-conditioning unit 310 has a control unit, a compressor, a heat exchanger, a fan, and the like (not shown). The control unit controls the air-conditioning unit 310 itself. The air-conditioning unit 310 generates cool air or warm air. The cool air or warm air generated by the air-conditioning unit 310 is carried through the ducts 320 and blown into each area from the blower unit 330 provided in the area. The air-conditioning unit 310 may be set inside the building BU.

The air-conditioning system 300 is provided with an air-flow quantity adjusting mechanism (not shown) that is, for example, an open and close valve having an adjustable degree of opening. The air-conditioning system 300 uses the air-flow quantity adjusting mechanism to adjust the air-flow quantity of the cool air or warm air supplied to each area, and can thereby control the temperature of each area. The air-conditioning system 300 may perform temperature control of each area by adjusting the temperature of the cool air or warm air supplied to each area in addition to, or instead of, adjusting the air-flow quantity.

The air-conditioning system 300 according to the present embodiment is capable of selectively performing conditioning in normal operating mode and conditioning in energy-saving operating mode, for each of the plurality of areas. Energy-saving operating mode has lower energy consumption than normal operating mode. In normal operating mode, the air-conditioning system 300 performs conditioning control so as to bring the temperature of the area closer to a target temperature. The target temperature is set for each area in advance.

In energy-saving operating mode, the air-conditioning system 300 performs conditioning control so as to bring the temperature of the area closer to a post-adjustment target temperature. The post-adjustment target temperature is obtained by adjusting the target temperature to be more uncomfortable (a higher temperature during cooling and a lower temperature during heating). Therefore, energy consumption by the air-conditioning system 300 is reduced in energy-saving operating mode, compared to that in normal operating mode. Normal operating mode corresponds to a first operating mode. Energy-saving operating mode corresponds to a second operating mode.

The air-conditioning control system 10 controls the air-conditioning system 300. For example, the air-conditioning control system 10 sets the air-conditioning operating mode (normal operating mode or energy-saving operating mode) for each area, based on the reception state of ultrasonic waves US outputted from a mobile phone 400. The mobile phone 400 is carried by a user. The air-conditioning control system 10 then instructs the air-conditioning system 300 of the air-conditioning operating mode that has been set. The mobile phone 400 may be a so-called smartphone (multi-functional mobile phone). Alternatively, the mobile phone 400 may be a so-called feature phone that is not a smartphone.

The air-conditioning control system 10 includes a plurality of auxiliary remote controllers 100 and a main remote controller 200. The auxiliary remote controllers 100 are set in each area. The main remote controller 200 is capable of communicating with the auxiliary remote controllers 100. According to the present embodiment, the main remote controller 200 is set in an area inside the building BU other than the areas A to D.

Alternatively, the main remote controller 200 may be set on an external wall of the building BU. The main remote controller 200 may be set in any of the areas A to D. In this case, the main remote controller 200 and one of the auxiliary remote controllers 100 may be configured as an integrated apparatus. Alternatively, the main remote controller 200 and the air-conditioning unit 310 may be configured as an integrated apparatus. The auxiliary remote controller 100 corresponds to an auxiliary controller. The main remote controller 200 corresponds to a main controller.

Figure 2:
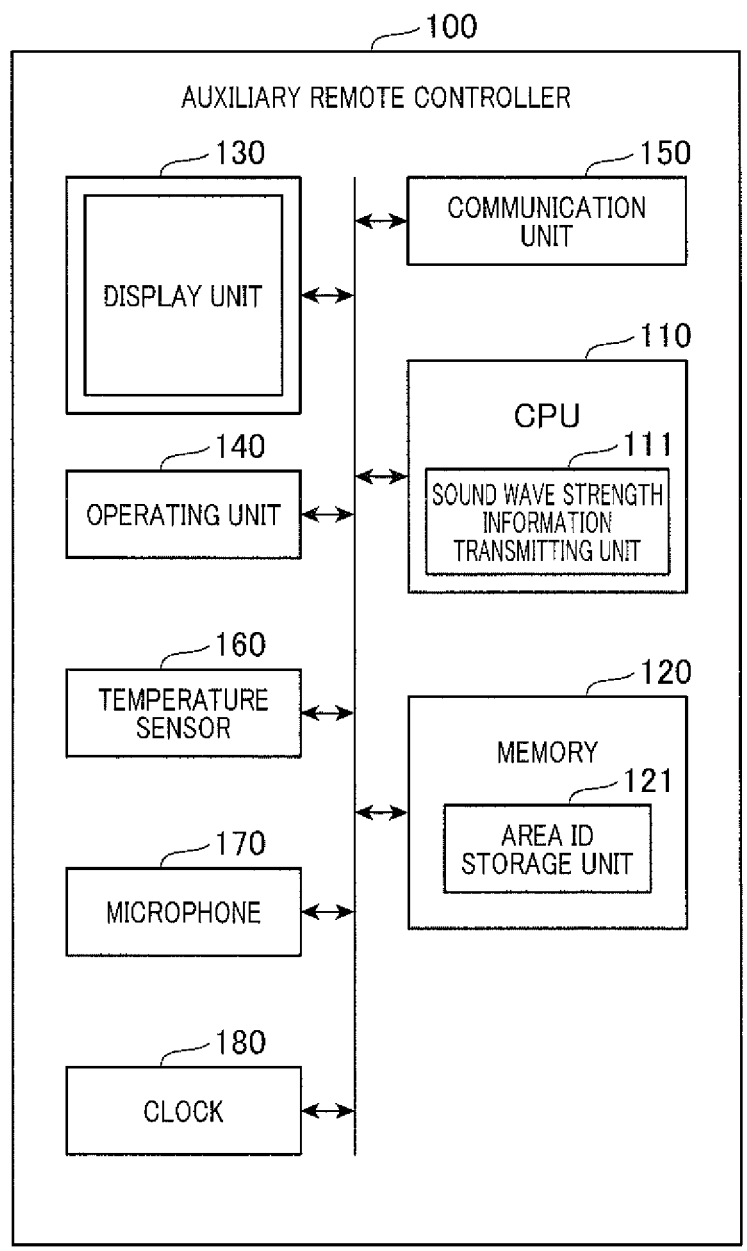
FIG. 2 is an explanatory diagram schematically showing a configuration of an auxiliary remote controller.

FIG. 2 is an explanatory diagram schematically showing a configuration of the auxiliary remote controller 100. The auxiliary remote controller 100 includes a display unit 130, an operating unit 140, a communication unit 150, a temperature sensor 160, a microphone 170, a clock 180, a central processing unit (CPU) 110, and a memory 120. These elements are electrically connected to one another by an internal bus.

The display unit 130 is configured by a liquid crystal panel. The display unit 130 displays various types of setting information, various types of menu screens, the temperature of the area (room temperature) detected by the temperature sensor 160, and the like. The display unit 130 may also display sound wave reception strength (described hereafter) at the microphone 170. The display unit 130 may be configured by a display device other than the liquid crystal panel.

The operating unit 140 receives various operations made by the user. A configuration may be used in which the display unit 130 and the operating unit 140 are integrated, such as a touch panel. The communication unit 150 communicates with the main remote controller 200. The communication may be wired or wireless communication. The microphone 170 receives sound waves (including ultrasonic waves US) and converts the sound waves to electrical signals. The microphone 170 corresponds to a sound wave receiving unit.

The memory 120 is configured by an electrically erasable programmable read-only memory (EEPROM). The memory 120 stores therein a control program. The memory 120 also includes an area identifier (ID) storage unit 121. The area ID storage unit 121 stores therein an area ID. The area ID identifies the area in which the auxiliary remote controller 100 is set.

The CPU 110 runs the control program that is stored in the memory 120. The CPU 110 thereby controls the operation of the auxiliary remote controller 100. For example, the CPU 110 transmits operating signals and information, together with the area ID, to the main remote controller 200 via the communication unit 150. The operating signals that are transmitted at this time are based on the content of an operation performed on the operating unit 140. The information transmitted at this time indicates the temperature detected by the temperature sensor 160. The area ID is stored in the area ID storage unit 121.

In addition, the CPU 110 sets the time of the clock 180 based on a time synchronization command received from the main remote controller 200 via the communication unit 150. As a result, the time of the clock 180 is synchronized among the auxiliary remote controllers 100. The CPU 110 also functions as a sound wave strength information transmitting unit 111. The sound wave strength information transmitting unit 111 transmits sound wave strength information, together with the area ID stored in the area ID storage unit 121, to the main remote controller 200 via the communication unit 150. The sound wave strength information indicates the sound wave reception strength at the microphone 170.

Figure 3:
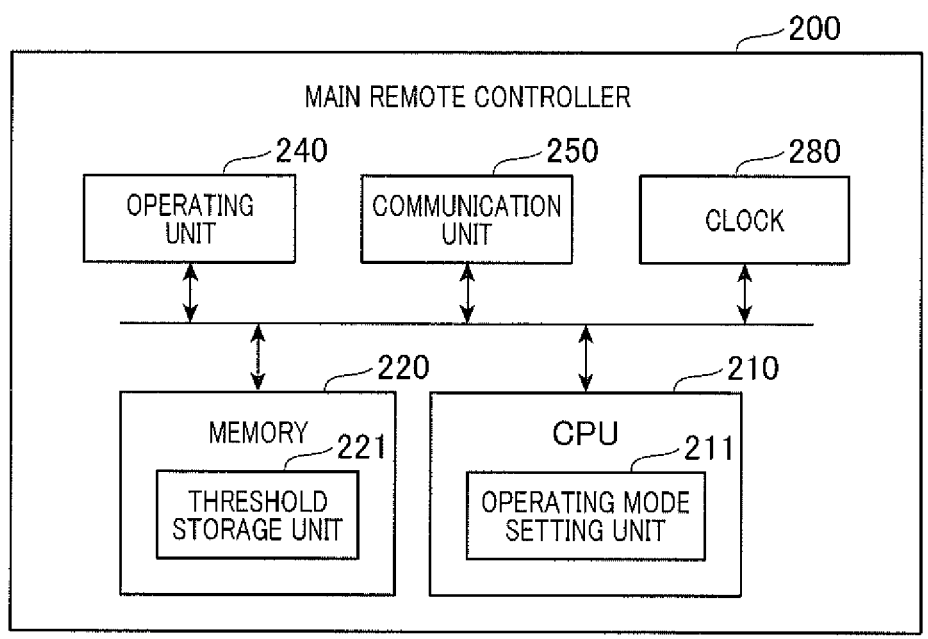
FIG. 3 is an explanatory diagram schematically showing a configuration of a main remote controller.

FIG. 3 is an explanatory diagram schematically showing a configuration of the main remote controller 200. The main remote controller 200 includes an operating unit 240, a communication unit 250, a clock 280, a CPU 210, and a memory 220. These elements are electrically connected to one another by an internal bus.

The operating unit 240 receives various operations made by the user. The communication unit 250 performs communication (wired or wireless communication) between the auxiliary remote controllers 100 and the air-conditioning unit 310. The communication between the main remote controller 200, the auxiliary remote controllers 100 and the air-conditioning unit 310 is not limited to direct communication. Indirect communication may be performed with a relay apparatus of some kind therebetween.

The memory 220 is configured by an EEPROM. The memory 220 stores therein a control program. The memory 220 also includes a threshold storage unit 221.

The CPU 210 runs the control program stored in the memory 220. The CPU 210 thereby controls the operation of the main remote controller 200. For example, the CPU 210 instructs the air-conditioning system 300 of the air-flow quantity for each area and the like, via the communication unit 250. The CPU 210 gives the instruction based on the information indicating the temperature received from the auxiliary remote controller 100 set in each area.

In addition, the CPU 210 repeatedly transmits a time synchronization command to each auxiliary remote controller 100 via the communication unit 250, at a predetermined timing. The time synchronization command is issued to synchronize the time of the clock 180 among the auxiliary remote controllers 100. The time synchronization command includes time information indicating the clock 280.

The threshold storage unit 221 stores therein a threshold X of the sound wave reception strength that is set in advance. In general, sound waves, including the ultrasonic waves US, have the following properties. That is, in comparison to radio waves, sound waves are easily obstructed by objects, and do not easily travel around and behind objects. In addition, sound waves tend to attenuate when passing through air.

For example, when sound waves travel around an object, the strength significantly weakens. Therefore, the strength of the ultrasonic waves US outputted from the mobile phone 400 (see FIG. 1) becomes extremely weak at the position of the auxiliary remote controller 100 that is set in an area (such as an adjacent room) in which an object is present between the auxiliary remote controller 100 and the mobile phone 400. The object is, for example, the wall WA, the floor FL, or the ceiling CE.

According to the present embodiment, the threshold X is set in advance as follows. The threshold X is set to be lower than the reception strength of the ultrasonic waves US at the auxiliary remote controller 100 when an object is not present between the mobile phone 400 and the auxiliary remote controller 100. An example of this instance is when the mobile phone 400 is positioned inside the area in which the auxiliary remote controller 100 is set. In addition, the threshold X is set to be higher than the reception strength of the ultrasonic waves US at the auxiliary remote controller 100 when an object is present between the mobile phone 400 and the auxiliary remote controller 100. An example of this instance is when the mobile phone 400 is positioned outside of the area in which the auxiliary remote controller 100 is set.

As a result, it can be said that when the reception strength of the ultrasonic waves US at the auxiliary remote controller 100 is the threshold X or higher, the probability of the mobile phone 400 (person holding the mobile phone 400) being present in the area in which the auxiliary remote controller 100 is set is high. Conversely, it can be said that when the reception strength of the ultrasonic waves US at the auxiliary remote controller 100 is less than the threshold X, the probability of the mobile phone 400 being present in the area in which the auxiliary remote controller 100 is set is low.

The CPU 210 also functions as an operating mode setting unit 211. The operating mode setting unit 211 compares the sound wave strength information received from each auxiliary remote controller 100 with the threshold X stored in the threshold storage unit 221. The operating mode setting unit 211 thereby sets the operating mode of the air-conditioning system 300 for each area. The operating mode setting unit 221 then instructs the air-conditioning system 300 to operate in the set mode.

Figure 4:
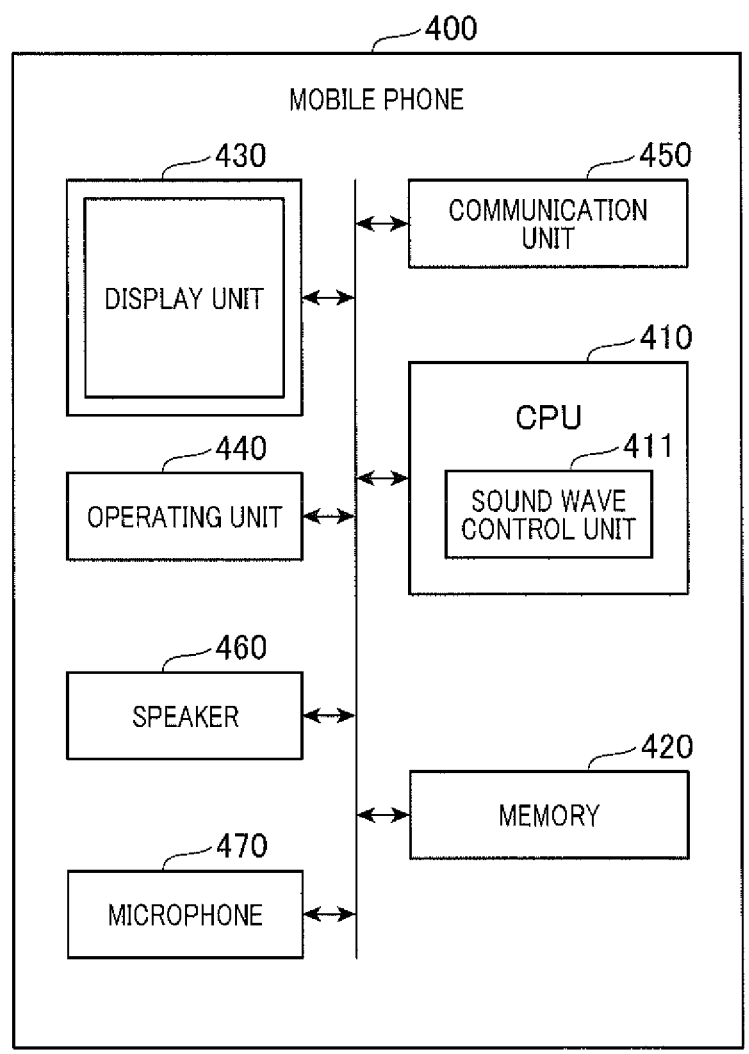
FIG. 4 is an explanatory diagram schematically showing a configuration of a mobile phone.

FIG. 4 is an explanatory diagram schematically showing a configuration of the mobile phone 400. The mobile phone 400 includes a display unit 430, an operating unit 440, a communication unit 450, a speaker 460, a microphone 470, a CPU 410, and a memory 420. These elements are electrically connected to one another by an internal bus.

The display unit 430 is configured by a liquid crystal panel. The display unit 430 displays various types of information and screens, and the like. The display unit 430 may be configured by a display device other than the liquid crystal panel.

The operating unit 440 receives various operations made by the user. A configuration may be used in which the display unit 430 and the operating unit 440 are integrated, such as a touch panel.

The communication unit 450 communicates with another apparatus (such as an access point AP that is set inside the building BU, shown in FIG. 1) by mobile communication, wireless local area network (LAN), or the like.

The speaker 460 changes electrical signals to mechanical vibration, and outputs sound (sound waves). According to the present embodiment, the speaker 460 can output ultrasonic waves US (sound waves having a frequency of 16 to 20 kHz or higher), in addition to audible sound waves.

The microphone 470 receives sound waves, and converts the sound waves into electrical signals.

The memory 420 is configured by an EEPROM. The memory 420 stores therein a control program.

The CPU 410 runs the control program that is stored in the memory 420. The CPU 140 thereby controls the operation of the mobile phone 400. For example, the CPU 410 controls the communication unit 450 and performs communication with the access point AP that is set inside the building BU. The CPU 410 also runs an application program that is stored in the memory 420. The CPU 410 thereby functions as a sound wave control unit 411.

The sound wave control unit 411 controls the speaker 460 and makes the speaker 460 output sound waves of a predetermined frequency at a predetermined timing. According to the present embodiment, the sound wave control unit 411 makes the speaker 460 intermittently output ultrasonic waves US during a period in which the communication unit 450 is capable of communicating with the access point AP that is set inside the building BU (in other words, during a period in which the mobile phone 400 is considered to be positioned inside or in the periphery of the building BU).

A-2. Air-Conditioning Control Process

FIG. 5 is a sequence chart of the flow of an air-conditioning control process according to the first embodiment. In order from the left side, FIG. 5 shows a processing flow of the mobile phone 400, a processing flow of the auxiliary remote controller 100, a processing flow of the main remote controller 200, and a processing flow of the air-conditioning system 300.

As described above, the sound wave control unit 411 of the mobile phone 400 makes the speaker 460 intermittently output ultrasonic waves US during the period in which the communication unit 450 is capable of communicating with the access point AP that is set inside the building BU (step S410).

The microphone 170 of the auxiliary remote controller 100 set in each area receives the ultrasonic waves US outputted from the mobile phone 400 (step S110). At a timing that is common among the auxiliary remote controllers 100, the sound wave strength information transmitting unit 111 of each auxiliary remote controller 100 transmits the sound wave strength information, together with the area ID stored in the area ID storage unit 121, to the main remote controller 200 via the communication unit 150 (step S120). The sound wave strength information indicates the reception strength of the ultrasonic waves US received by the microphone 170.

Even when the reception strength of the ultrasonic waves US at the microphone 170 is zero (including values extremely close to zero), or in other words, even when the microphone 170 does not receive the ultrasonic waves US, the sound wave strength information transmitting unit 111 transmits the sound wave strength information to the main remote controller 200. The sound wave strength information in this case indicates that the ultrasonic waves US have not been received by the microphone 170. The auxiliary remote controllers 100 repeatedly perform the above-described reception of sound waves and transmission of sound wave strength information.

The operating mode setting unit 211 of the main remote controller 200 receives the sound wave strength information transmitted from each auxiliary remote controller 100, via the communication unit 250 (step S210).

When the sound wave strength information is received from each auxiliary remote controller 100, the operating mode setting unit 211 compares the sound wave strength indicated by the sound wave strength information with the threshold X stored in the threshold storage unit 221. The operating mode setting unit 211 thereby sets the air-conditioning operating mode for each area (step S220).

Specifically, the operating mode setting unit 211 sets the air-conditioning operating mode to normal operating mode or energy-saving mode as follows. For example, at least a single piece of sound wave strength information indicating a sound wave strength that is the threshold X or higher (referred to, hereinafter, as specific sound wave strength information) is included in the received pieces of sound wave strength information. In this case, the operating mode setting unit 211 sets the operating mode to normal operating mode for all areas in which the auxiliary remote controller 100 that is the transmission source of the specific sound wave strength information is located.

The operating mode setting unit 211 sets the operating mode to energy-saving mode for all other areas. The operating mode setting unit 211 instructs the air-conditioning system 300 of the set operating mode, via the communication unit 250 (step S230).

The main remote controller 200 repeatedly performs the above-described setting and instruction of the air-conditioning operating mode. The air-conditioning system 300 performs conditioning in the operating mode instructed by the main remote controller 200 for each area (step S310).

Figure 6A:
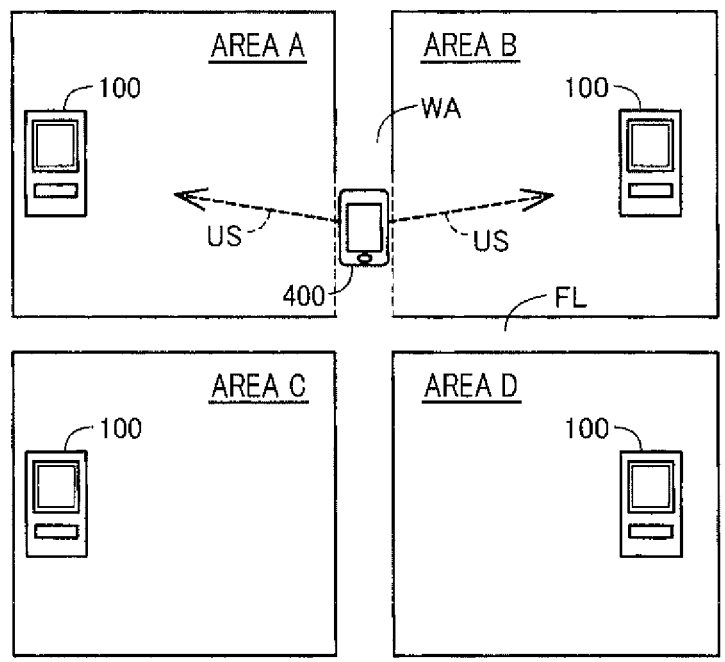
FIGS. 6A and 6B are explanatory diagrams of an example of a method for setting air-conditioning operating mode according to the first embodiment.
Figure 6B:
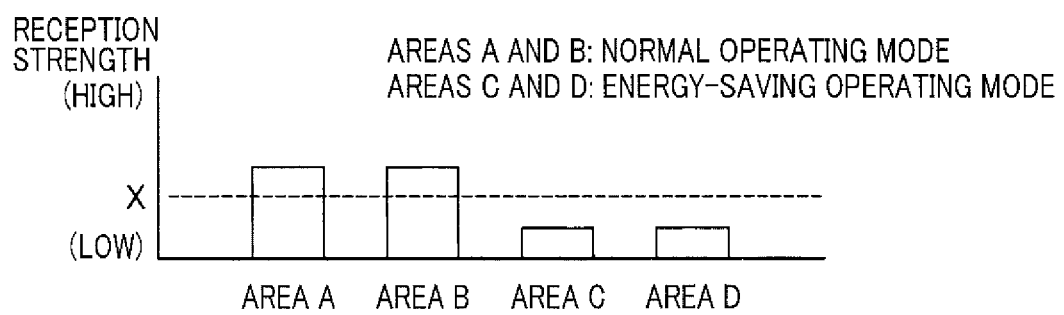

FIGS. 6A and 6B to 8A and 8B are explanatory diagrams of examples of a method for setting the air-conditioning operating mode according to the first embodiment. FIGS. 6A and 6B show a state in which the mobile phone 400 (person holding the mobile phone 400; the same applies hereafter) is positioned in an intermediate point between an open entrance door of area A and an open entrance door of area B.

As described above, the threshold X is set as follows. That is, the threshold X is set to be lower than the reception strength of the ultrasonic waves US at the auxiliary remote controller 100 when an object is not present between the mobile phone 400 and the auxiliary remote controller 100. In addition, the threshold X is set to be higher than the reception strength of the ultrasonic waves US at the auxiliary remote controller 100 when an object is present between the mobile phone 400 and the auxiliary remote controller 100.

Therefore, in the state shown in FIGS. 6A and 6B, the reception strength of the ultrasonic waves US at the auxiliary remote controllers 100 in areas A and B is the threshold X or higher. However, the reception strength of the ultrasonic waves US at the auxiliary remote controllers 100 in areas C and D is less than the threshold X. In this case, areas A and B are set to normal operating mode. Areas C and D are set to energy-saving operating mode.

Figure 7A:
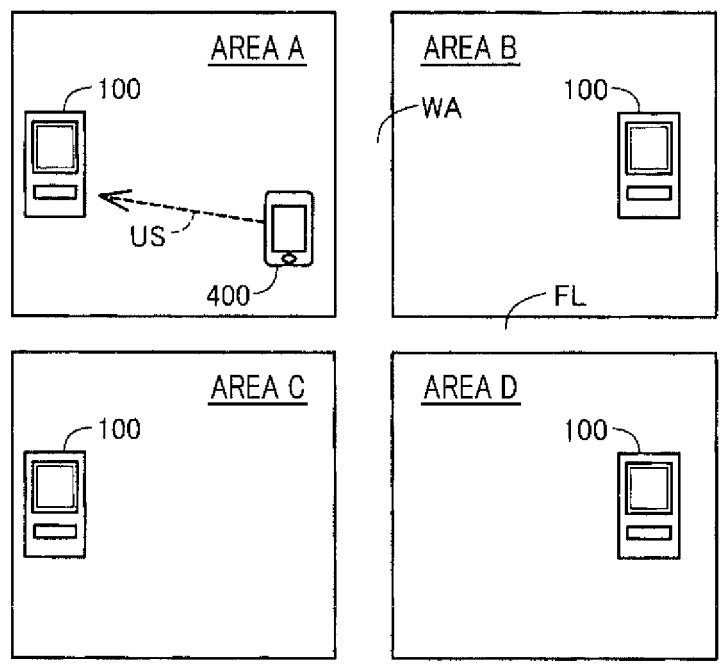
FIGS. 7A and 7B are explanatory diagrams of an example of the method for setting air-conditioning operating mode according to the first embodiment.
Figure 7B:
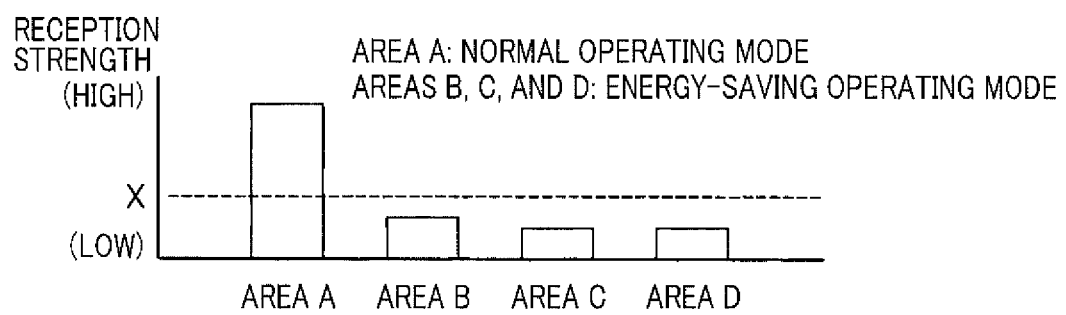

FIGS. 7A and 7B show a state in which the mobile phone 400 has moved into area A from the position shown in FIGS. 6A and 6B, and the entrance door of area A is closed. In the state shown in FIGS. 7A and 7B, the reception strength of the ultrasonic waves US at the auxiliary remote controller 100 in area A is the threshold X or higher. However, the reception strength of the ultrasonic waves US at the auxiliary remote controllers 100 in areas B, C, and D is less than the threshold X. In this case, area A is set to normal operating mode. Areas B, C, and D are set to energy-saving operating mode.

Figure 8A:
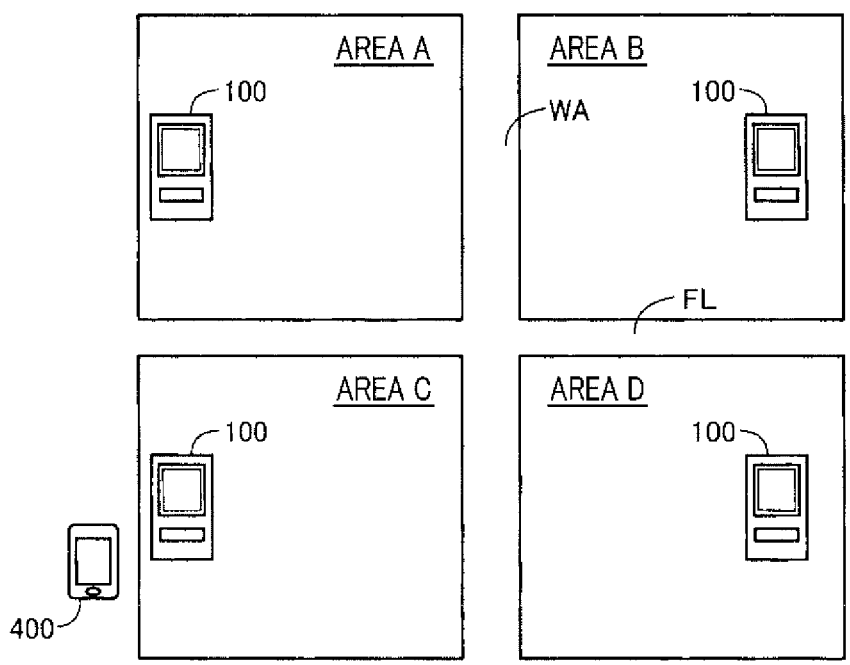
FIGS. 8A and 8B are explanatory diagrams of an example of the method for setting air-conditioning operating mode according to the first embodiment.
Figure 8B:
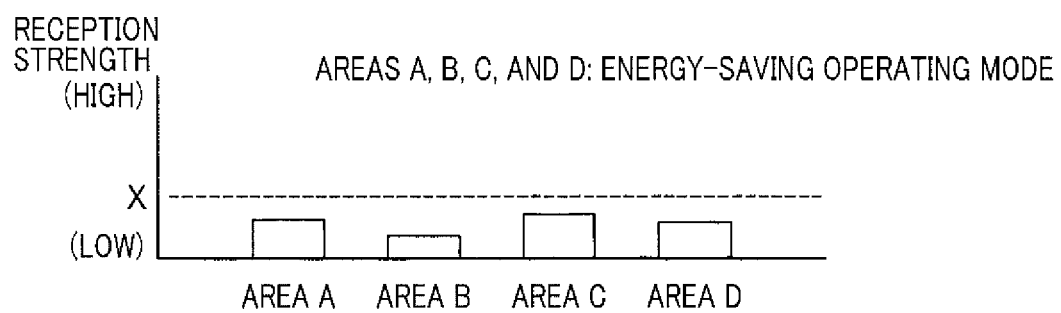

FIGS. 8A and 8B show a state in which the mobile phone 400 is positioned outside of areas A to D. In the state shown in FIGS. 8A and 8B, the reception strength of the ultrasonic waves US at the auxiliary remote controllers 100 in areas A, B, C, and D is less than the threshold X. In this case, areas A, B, C, and D are set to energy-saving operating mode.

In this way, in the air-conditioning control system 10 according to the present embodiment, each auxiliary remote controller 100 receives the sound waves outputted from the mobile phone 400. In addition, each auxiliary remote controller 100 transmits, to the main remote controller 200, the sound wave strength information indicating the reception strength of the sound waves.

In addition, when the specific sound wave strength information indicating a sound wave strength that is the threshold X or higher is included in the pieces of sound wave strength information received from the auxiliary remote controllers 100, the main remote controller 200 sets all areas in which the auxiliary remote controller 100 that is the transmission source of the specific sound wave strength information is set to normal operating mode. The main remote controller 200 sets the remaining areas to energy-saving operating mode.

Therefore, in the air-conditioning control system 10 according to the present embodiment, operating mode setting that takes into consideration whether or not a person is present in each area can be actualized without a human detecting sensor being set in each area. In addition, the sound wave reception strength at the auxiliary remote controller 100 that is set in an area can be expected to be a certain level or higher, as long as the mobile phone 400 that outputs sound waves is positioned inside this area.

In addition, sound waves have the following properties. That is, in comparison to radio waves, sound waves are easily obstructed by objects, and do not easily travel around and behind objects. In addition, sound waves tend to attenuate when passing through air. For example, when an object is present between the mobile phone 400 and the auxiliary remote controller 100, such as in the case of an auxiliary remote controller 100 that is set in an area adjacent to the area in which the mobile phone 400 that outputs sound waves is positioned, the sound wave reception strength at the auxiliary remote controller 100 is expected to be extremely low. Therefore, whether or not a person is present in each area can be accurately determined.

As a result, in the air-conditioning control system 10 according to the present embodiment, energy consumption by the central-type air-conditioning system 300 can be effectively reduced without compromising the comfort of air-conditioning, while preventing complexity in system configuration.

In addition, in the air-conditioning control system 10 according to the present embodiment, when there are a plurality of areas in which it is highly probable that the mobile phone 400 is present (see FIGS. 6A and 6B), all such areas are set to normal operating mode. When the area in which it is highly probable that the mobile phone 400 is present subsequently becomes only a single area, it can be considered that the mobile phone 400 has moved into this area. Therefore, only this area is set to normal operating mode.

There is generally a time lag from when the main remote controller 200 gives an instruction until the air-conditioning system 300 starts actual operation. As described above, when there are a plurality of areas in which it is highly probable that the mobile phone 400 is present, as described above, all such areas are set to normal operating mode. As a result, air-conditioning operation performed after the area in which it is highly probable that the mobile phone 400 is present subsequently becomes only a single area can be smoothly performed. The comfort of air-conditioning can be improved.

In addition, in the air-conditioning control system 10 according to the present embodiment, the auxiliary remote controllers 100 repeatedly perform reception of sound waves and transmission of sound wave strength information to the main remote controller 200 at a common timing. The main remote controller 200 repeatedly performs setting of the air-conditioning operating mode for each area. Therefore, even when the mobile phone 400 moves, the air-conditioning operating mode of each room can be set to the optimal mode based on the position of the mobile phone 400.

In addition, in the air-conditioning control system 10 according to the present embodiment, the area ID is stored in the area ID storage unit 121 of each auxiliary remote controller 100. The area ID identifies the area in which the auxiliary remote controller 100 is set. The sound wave strength information transmitting unit 111 transmits the sound wave strength information, together with the area ID, to the main remote controller 200. Therefore, the main remote controller 200 can appropriately set the air-conditioning operating mode for each area. In addition, the main remote controller 200 can instruct the air-conditioning system 300 to perform air-conditioning in the mode set for each area.

FIG. 9 is an explanatory diagram summarizing the relationship between the sound wave reception state in the auxiliary remote controller 100 and the operating mode set for each area according to the first embodiment. In the schematic diagrams shown in FIG. 9, the thick solid lines indicate the boundaries of the area. In addition, the thin solid lines indicate the range of the position of the mobile phone 400 over which the sound wave reception strength at the auxiliary remote controller 100 is the threshold X or higher. The broken lines indicate the range over which the sound wave reception strength at the auxiliary remote controller 100 is greater than zero and less than the threshold X. When the mobile phone 400 is positioned in the areas outside of the broken lines, the sound wave reception strength at the auxiliary remote controller 100 is zero. In addition, the shaded area indicates an area set to normal operating mode.

As shown in pattern 1, when a plurality of auxiliary remote controllers 100 receive sound waves having a strength that is the threshold X or higher, all areas receiving the sound waves having a strength that is the threshold X or higher are set to normal operating mode.

As shown in pattern 2, when a single auxiliary remote controller 100 receives sound waves having a strength that is the threshold X or higher, and the remaining auxiliary remote controllers 100 receive sound waves having a strength that is lower than the threshold X, the area receiving the sound waves having the strength that is the threshold X or higher is set to normal operating mode. Areas receiving the sound waves having a strength that is lower than the threshold X are set to energy-saving operating mode.

As shown in pattern 3, when a single auxiliary remote controller 100 receives sound waves having a strength that is the threshold X or higher, and the remaining auxiliary remote controllers 100 do not receive sound waves, the area receiving the sound waves having a strength that is the threshold X or higher is set to normal operating mode. Areas that do not receive the sound waves are set to energy-saving operating mode.

As shown in pattern 4, when a plurality of auxiliary remote controllers 100 receive sound waves having a strength that is less than the threshold X, all areas receiving the sound waves having a strength that is less than the threshold X are set to energy-saving operating mode.

As shown in pattern 5, when a single auxiliary remote controller 100 receives sound waves having a strength that is less than the threshold X, and the other auxiliary remote controllers 100 do not receive sound waves, the area receiving the sound waves having a strength that is less than the threshold X and the areas that do not receive sound waves are set to energy-saving operating more.

As shown in pattern 6, when none of the auxiliary remote controllers 100 receive sound waves, all areas that do not received sound waves are set to energy-saving operating mode.

B. Second Embodiment

Figure 10:
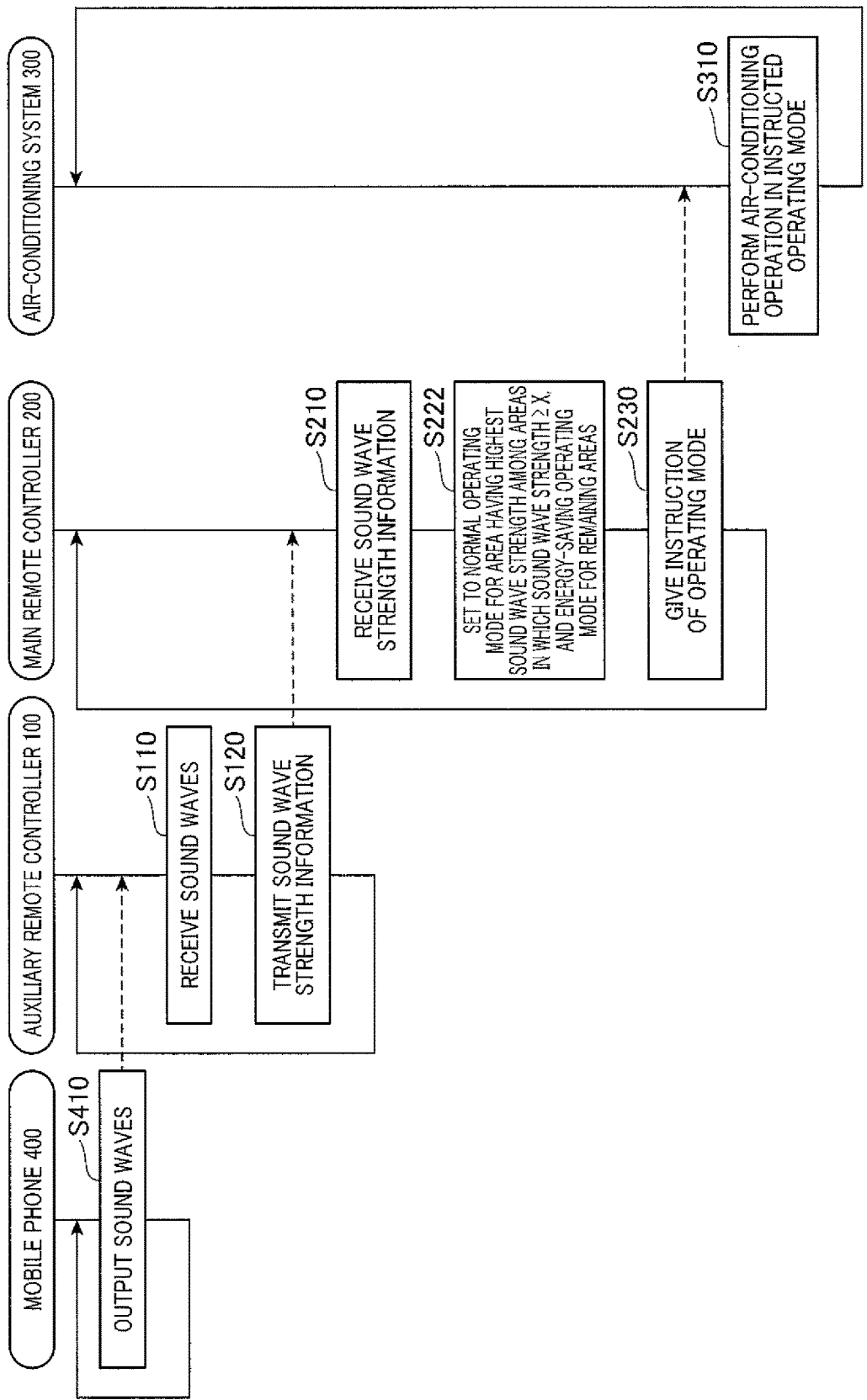
FIG. 10 is a sequence diagram of the flow of the air-conditioning control process according to a second embodiment.

FIG. 10 shows a sequence chart of the flow of the air-conditioning control process according to a second embodiment. The air-conditioning control process according to the second embodiment differs from that according to the first embodiment shown in FIG. 5 regarding the content of the process for setting the air-conditioning operating mode for each area (step S222 in FIG. 10). The air-conditioning control process according to the second embodiment is similar to that according to the first embodiment in other aspects.

As shown in FIG. 10, according to the second embodiment, for example, at least a single piece of specific sound wave strength information is present among the pieces of sound wave strength information received from the auxiliary remote controllers 100. The specific sound wave strength information indicates a sound wave strength that is the threshold X or higher. In this case, the operating mode setting unit 211 of the main remote controller 200 (see FIG. 3) sets the operating mode to normal operating mode for the area in which the auxiliary remote controller 100 that is the transmission source of the specific sound wave strength information indicating the highest sound wave strength is set. The operating mode setting unit 211 sets the operating mode to energy-saving operating mode for all other areas. In other words, according to the second embodiment, a plurality of areas are not set to normal operating mode.

FIGS. 11A and 11B to 13A and 13B are explanatory diagrams of examples of the method for setting the air-conditioning operating mode according to the second embodiment. In a manner similar to FIGS. 6A and 6B, FIGS. 11A and 11B show a state in which the mobile phone 400 (person holding the mobile phone 400; the same applies hereafter) is positioned in an intermediate point between an open entrance door of area A and an open entrance door of area B.

Figure 11A:
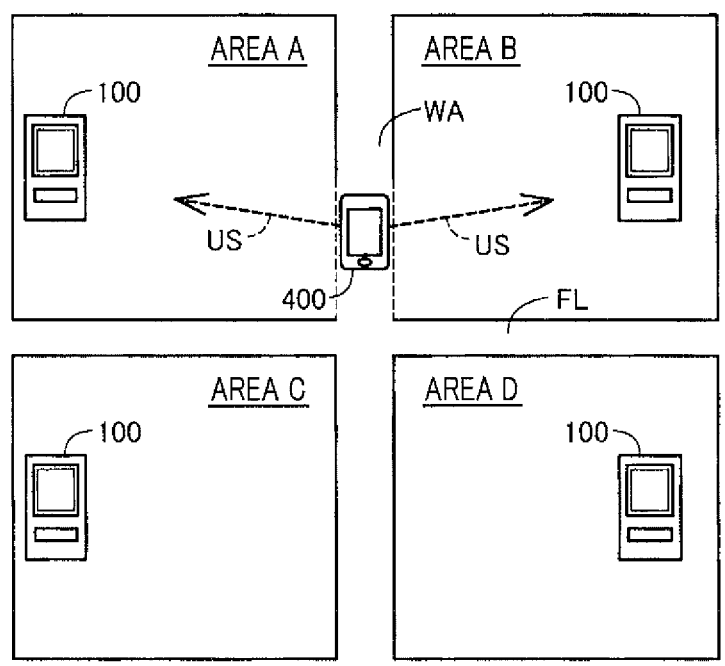
FIGS. 11A and 11B are explanatory diagrams of an example of the method for setting air-conditioning operating mode according to the second embodiment.
Figure 11B:
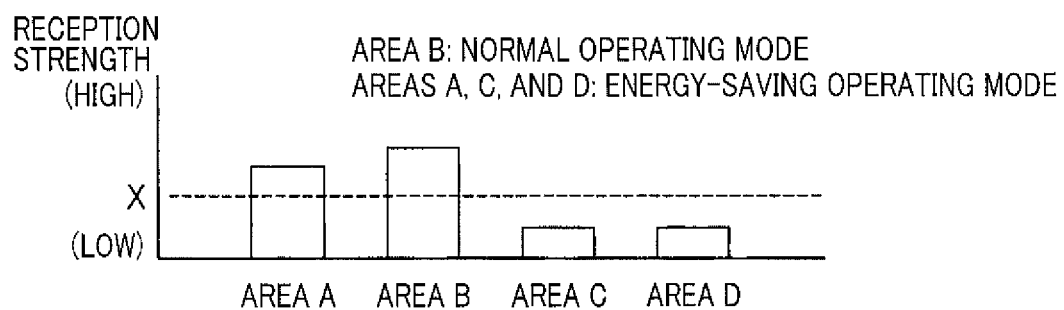

In the state shown in FIGS. 11A and 11B, the reception strength of the ultrasonic waves US at the auxiliary remote controllers 100 in areas A and B is the threshold X or higher. However, the reception strength of the ultrasonic waves US at the auxiliary remote controllers 100 in areas C and D is less than the threshold X. In this case, of areas A and B, area B in which the reception strength of the ultrasonic waves US is the highest is set to normal operating mode. Areas A, C, and D are set to energy-saving operating mode.

Figure 12A:
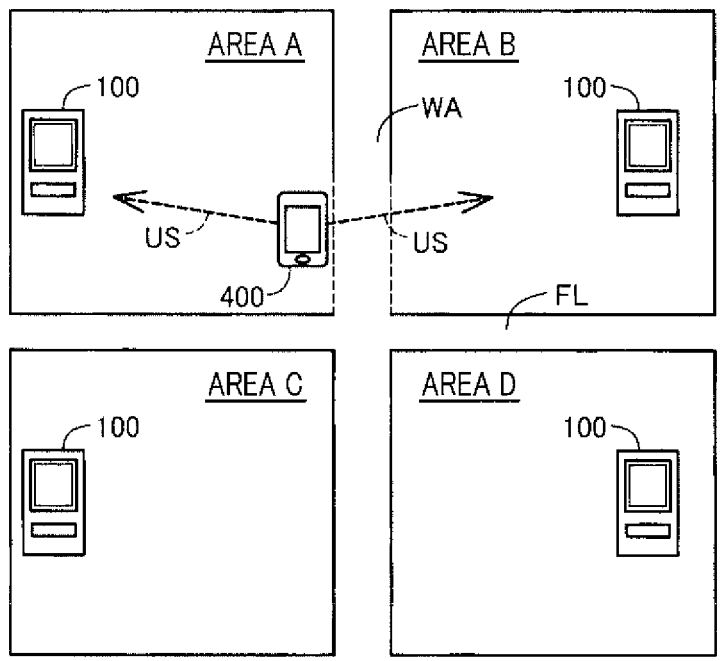
FIGS. 12A and 12B are explanatory diagrams of an example of the method for setting air-conditioning operating mode according to the second embodiment.
Figure 12B:
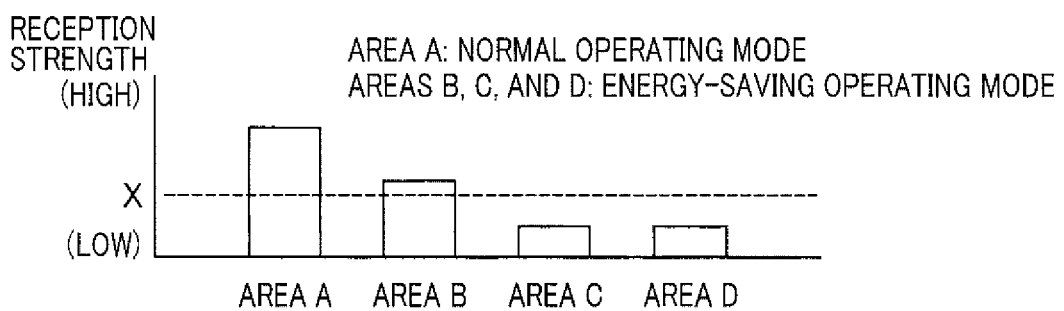

FIGS. 12A and 12B show a state in which the mobile phone 400 has moved into area A from the position shown in FIGS. 11A and 11B. Here, however, the entrance door of area A and the entrance door of area B are both open. In the state shown in FIGS. 12A and 12B, the reception strength of the ultrasonic waves US at the auxiliary remote controllers 100 in areas A and B is the threshold X or higher. However, the reception strength of the ultrasonic waves US at the auxiliary remote controllers 100 in areas C and D is less than the threshold X. In this case, of areas A and B, area A in which the reception strength of the ultrasonic waves US is the highest is set to normal operating mode. Areas B, C, and D are set to energy-saving operating mode.

Figure 13A:
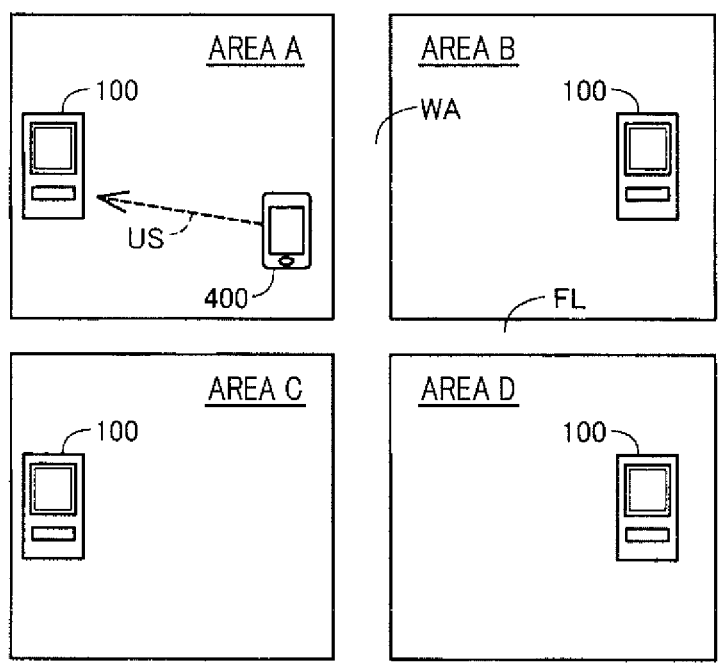
FIGS. 13A and 13B are explanatory diagrams of an example of the method for setting air-conditioning operating mode according to the second embodiment.
Figure 13B:
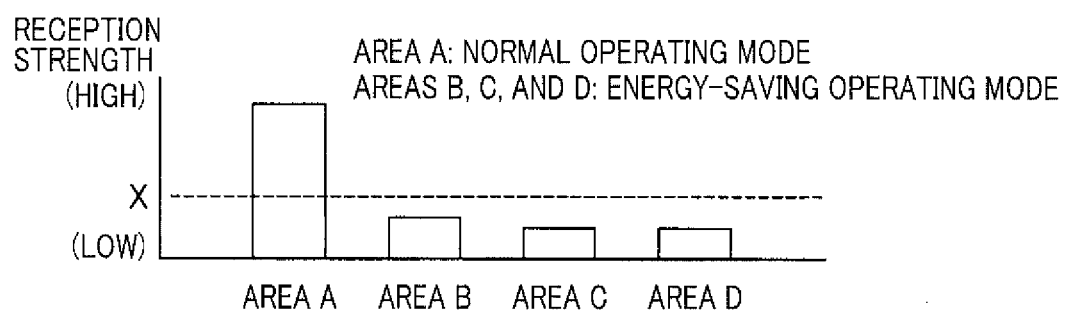

FIGS. 13A and 13B show a state in which the mobile phone 400 is positioned inside area A and the entrance door of area A is closed. In the state shown in FIGS. 13A and 13B, the reception strength of the ultrasonic waves US at the auxiliary remote controller 100 in area A is the threshold X or higher. However, the reception strength of the ultrasonic waves US at the auxiliary remote controllers 100 in areas B, C, and D is less than the threshold X. In this case, area A is set to normal operating mode. Areas B, C, and D are set to energy-saving operating mode.

In this way, in the air-conditioning control system 10 according to the second embodiment, for example, at least a single piece of specific sound wave strength information is present among the pieces of sound wave strength information received from the auxiliary remote controllers 100. The specific sound wave strength information indicates a sound wave strength that is the threshold X or higher. In this case, the main remote controller 200 sets the area in which the auxiliary remote controller 100 that is the transmission source of the specific sound wave strength information having the highest sound wave strength is set to normal operating mode. The main remote controller 200 sets the remaining areas to energy-saving operating mode.

Therefore, in a manner similar to that according to the above-described first embodiment, in the air-conditioning control system 10 according to the second embodiment, operating mode setting that takes into consideration whether or not a person is present in each area can be actualized without a human detecting sensor being set in each area. In addition, in the air-conditioning control system 10 according to the second embodiment, a plurality of areas are not set to normal operating mode. Therefore, energy consumption by the central-type air-conditioning system 300 can be further effectively reduced while ensuring the comfort of air-conditioning to a certain extent.

FIG. 14 is an explanatory diagram summarizing the relationship between the sound wave reception state in the auxiliary remote controller 100 and the operating mode set for each area according to the second embodiment. According to the second embodiment shown in FIG. 14, the method for setting the air-conditioning operating mode in pattern 1 differs from that according to the first embodiment shown in FIG. 9. Other aspects are similar to those according to the first embodiment.

As shown in pattern 1 in FIG. 14, according to the second embodiment, when a plurality of auxiliary remote controllers 100 receive sound waves having a strength that is the threshold X or higher, a single area receiving the sound waves having the highest strength is set to normal operating mode. The remaining areas are set to energy-saving operating mode.

C. Variation Examples

The present disclosure is not limited to the above-described embodiments. The present disclosure can be carried out according to various aspects without departing from the spirit of the invention. For example, the following variations are possible.

C-1. First Variation Example

According to the above-described embodiments, a plurality of areas inside the building BU are subjected to conditioning by the air-conditioning system 300. However, a plurality of areas other than those inside the building BU may be subjected to conditioning (for example, a movable body such as a train). In addition, the overall boundaries of each area are not required to be partitioned by objects, such as the walls WA, the floor FL, and the ceiling CE. All that is required is that at least a portion of the boundaries of each area is partitioned by an object. For example, openings may be formed in the walls WA, the floor FL, and the ceiling CR in the boundaries of the area.

In addition, the configuration of the auxiliary remote controller 100 (see FIG. 2) according to the above-described embodiments is merely an example. Various modifications are possible. For example, the auxiliary remote controller 100 is not necessarily required to include the display unit 130. In addition, the microphone 170 provided in the auxiliary remote controller 100 may be detachable.

In a similar manner, the configuration of the main remote controller 200 (see FIG. 3) according to the above-described embodiments is merely an example. Various modifications are possible. For example, the main remote controller 200 may include a display unit.

In addition, according to the above-described embodiment, some of the configurations actualized by hardware may be replaced with software. Conversely, some of the configurations actualized by software may be replaced with hardware. In addition, when some or all functions of the present disclosure are actualized by software, the software (computer program) can be provided so as to be stored in a computer-readable recording medium.

In the present disclosure, the "computer-readable storage medium" is not limited to a portable recording medium, such as a flexible disk or a compact disc-read only memory (CD-ROM). The computer-readable recording medium includes internal storage devices inside a computer, such as various types of random access memory (RAM) and read-only memory (ROM), and external storage devices fixed to the computer, such as a hard disk.

C-2. Second Variation Example

According to the above-described embodiments, the air-conditioning system 300 is capable of selectively performing conditioning in normal operating mode and conditioning in energy-saving operating mode. However, the operating mode of the air-conditioning system 300 is not limited to these modes. All that is required is that the air-conditioning system 300 is capable of performing conditioning in a first operating mode and conditioning in a second operating mode that has lower energy consumption than the first operating mode. In addition, the air-conditioning system 300 may be capable of performing conditioning in three or more types of operating modes having differing levels of energy consumption.

C-3. Third Variation Example

According to the above-described embodiments, whether or not the mobile phone 400 (person holding the mobile phone 400) is present in each area is determined using the ultrasonic waves US outputted from the mobile phone 400. However, a similar determination may be made using audible sound waves outputted from the mobile phone 400.

In addition, a similar determination may be made using sound waves (ultrasonic waves US or audible sound waves) outputted from a portable apparatus capable of outputting sound waves, other than the mobile phone 400. Such portable apparatuses include tablet-type terminals, laptop personal computers, and the like. Alternatively, a similar determination may be made using sound waves outputted from an apparatus that is carried on a person, other than the mobile phone 400. Such apparatuses that are carried on a person include, for example, so-called wearable computers in the form of glasses, wristwatches, hats, and the like.

In addition, according to the above-described embodiments, the frequency (frequency range) of the sound waves outputted from the mobile phone 400 (or an apparatus that is carried by a person) may be made to differ for each person. The auxiliary remote controller 100 may generate the sound wave strength information for each frequency (frequency range) and transmit the generated sound wave strength information to the main remote controller 200. As a result, erroneous determination of whether or not a person is present in each area can be prevented with further certainty.

In addition, energy consumption by the air-conditioning system 300 can be reduced with further certainty.

C-4. Fourth Variation Example

According to the above-described embodiments, the sound wave control unit 411 of the mobile phone 400 makes the speaker 460 intermittently output the sound waves (ultrasonic waves US or audible sound waves). However, the sound wave control unit 411 may make the speaker 460 continuously output the sound waves.

In addition, according to the above-described embodiments, the period over which the sound wave control unit 411 of the mobile phone 400 makes the speaker 460 output the sound waves is the period during which the communication unit 450 is capable of communicating with the access point AP that is set inside the building BU. However, variations in this period are possible. For example, this period may be a period during which the communication strength (specified by, for example, received signal strength indicator [RSSI]) between the communication unit 450 and the access point AP is a predetermined threshold or higher.

In addition, the mobile phone 400 may include a position identifying device, such as a global positioning system (GPS). In this case, this period may be a period during which the mobile phone 400 is identified as being present inside (or in the periphery of) the building BU. Alternatively, this period may be the overall period. In other words, the sound wave control unit 411 may make the speaker 460 output the sound waves at all times.

C-5. Fifth Variation Example

In the air-conditioning control system according to the above-described first embodiment, when the specific sound wave strength information indicating a sound wave strength that is the threshold X or higher is included in the pieces of sound wave strength information received from the auxiliary remote controllers 100, the main remote controller 200 sets all areas in which the auxiliary remote controller 100 that is the transmission source of the specific sound wave strength information is set to normal operating mode, and sets the remaining areas to energy-saving operating mode.

In this case, if a user holding the mobile phone 400 is moving back and forth between the respective areas, an area that is determined as normal operating mode (hereinafter referred to as "air-conditioning-on area") may be vary one after another. To prevent this, the air-conditioning control system may include means for changing the air-conditioning-on area after the movement area of the user has been settled to a certain degree.

Figure 15:
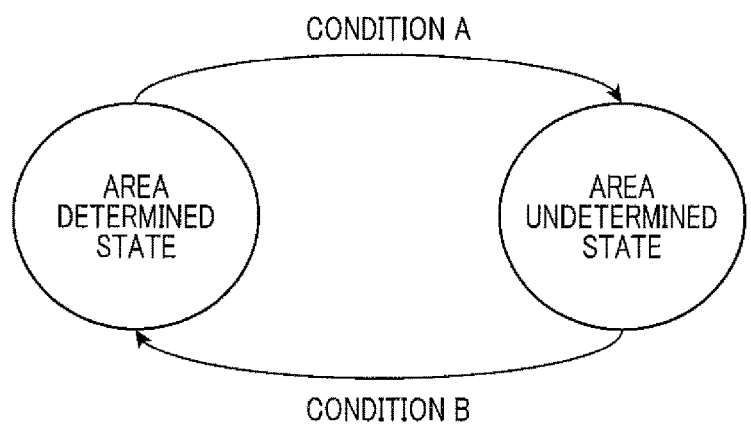
FIG. 15 is an explanatory diagram of an example of means for changing an air-conditioning-on area (an area determined in normal operating mode) according to fifth and sixth variation examples.
Figure 16:
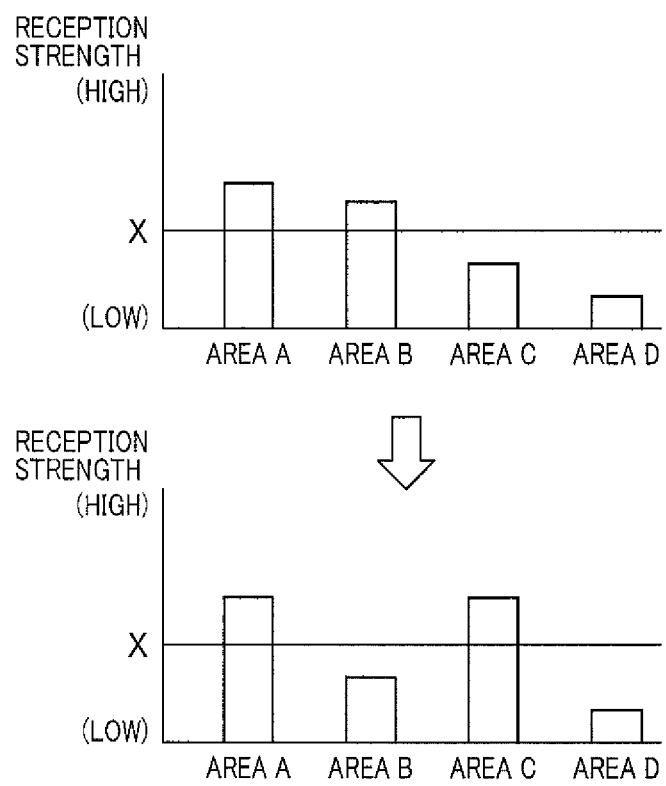
FIG. 16 is an explanatory diagram of an example of means for changing the air-conditioning-on area according to the fifth variation example.

FIGS. 15 and 16 show one example of the means for changing the air-conditioning-on area. In this case, the operating mode setting unit 211 of the main remote controller 200 may set the air-conditioning operating mode for each area, based on predetermined two states, i.e., an area determined state and an area undetermined state (described below) that can be shifted to each other on the basis of predetermined two conditions, i.e., conditions A and B described below.

In FIG. 15, the operating mode setting unit 211 may judge that a condition A is satisfied when the number N of areas having the sound wave strength higher than the threshold X has been larger than 1 (i.e., N is 2 or more), and a condition B is satisfied when the number N of areas having the sound wave strength higher than the threshold X has been equal to or smaller than 1 (i.e., N is 1 or 0).

As shown in FIG. 15, when the condition A is satisfied, the operating mode setting unit 211 shifts to an area undetermined state. In the area undetermined state, the air-conditioning-on area having the sound wave strength higher than the threshold X upon the start of the area undetermined state continues to be determined as the air-conditioning-on area, as long as the determined air-conditioning-on area has the sound wave strength higher than the threshold X (when the sound wave strength of the determined air-conditioning-on area has been equal to or lower than the threshold X, the setting of the air-conditioning-on area is released). The air-conditioning-on area is unchanged until the operating mode setting unit 211 shifts to the area determined state when the condition B is satisfied. During the area undetermined state, the operating mode setting unit 211 always detects the number of areas having the sound wave strength higher than the threshold X and, based on the detected number of areas, determines whether or not the condition B is satisfied.

As shown in FIG. 15, when the condition B is satisfied, the operating mode setting unit 211 shifts to an area determined state. In the area determined state, when the number N of areas having the sound wave strength higher than the threshold X is 1, the corresponding one area is determined as the air-conditioning-on area. When the number N of areas having the sound wave strength higher than the threshold X is 0, any area is not determined as the air-conditioning-on area (i.e., the air-conditioning-on area is not present). When the condition A is satisfied, the operating mode setting unit 211 shifts to the area determined state.

In this example, the operating mode setting unit 211 sets the air-conditioning operating mode for each area (step S220 in FIG. 5). When it is judged that the condition A is satisfied when the number N of areas having the sound wave strength higher than the threshold X has been larger than 1, the operating mode setting unit 211 shifts to the area undetermined state. When it is judged that the condition B is satisfied when the number N of areas having the sound wave strength higher than the threshold X has been equal to or smaller than 1.

For example, in FIG. 6 as described above, when two areas A and B of four areas A to D, have the sound wave strength higher than the threshold X, the operating mode setting unit 211 shifts to the area undetermined state. In this area undetermined state, as shown in FIG. 16, even when the sound wave strength of the area B has been changed to be lower than the threshold X and even when the sound wave strength of the area C has been changed to be higher than the threshold X, the air-conditioning-on area have the sound wave strength higher than the threshold X upon the start of the area undetermined state is determined as the air-conditioning-on area, and then, the area A continues to be determined as the air-conditioning-on area (the area B is released from the air-conditioning-on area, and the area C is not determined as the air-conditioning-on area).

From this, even if the user is moving back and forth between the respective areas, the air-conditioning-on area does not vary one after another, until the movement area of the user has been settled to a certain degree.

C-6. Sixth Variation Example

In the above-described second embodiment, when at least a single piece of specific sound wave strength information indicating a sound wave strength that is the threshold X or higher is present among the pieces of sound wave strength information received from the auxiliary remote controllers 100, the main remote controller 200 sets the area in which the auxiliary remote controller 100 that is the transmission source of the specific sound wave strength information having the highest sound wave strength is set to normal operating mode, and sets the remaining areas to energy-saving operating mode.

In this case, if a user holding the mobile phone 400 is moving back and forth between the respective areas, an area that is determined as normal operating mode (hereinafter referred to as "air-conditioning-on area") may be vary one after another. To prevent this, the air-conditioning control system may include means for changing the air-conditioning-on area after the movement area of the user has been settled to a certain degree.

FIGS. 15 and 17 show one example of the means for changing the air-conditioning-on area. In this case, the operating mode setting unit 211 of the main remote controller 200 may set the air-conditioning operating mode for each area, based on predetermined two states, i.e., an area determined state and an area undetermined state (described below) that can be shifted to each other on the basis of predetermined two conditions, i.e., conditions A and B described below.

In FIG. 15, the operating mode setting unit 211 may judge that a condition A is satisfied when the number N of areas having the sound wave strength higher than the threshold X has been larger than 1 (i.e., N is 2 or more), and a condition B is satisfied when the number N of areas having the sound wave strength higher than the threshold X has been equal to or smaller than 1 (i.e., N is 1 or 0).

As shown in FIG. 15, when the condition A is satisfied, the operating mode setting unit 211 shifts to an area undetermined state. In the area undetermined state, the air-conditioning-on area having the highest sound wave strength higher than the threshold X upon the start of the area undetermined state continues to be determined as the air-conditioning-on area, as long as the determined air-conditioning-on area has the sound wave strength higher than the threshold X (when the sound wave strength of the determined air-conditioning-on area has been equal to or lower than the threshold X, the setting of the air-conditioning-on area is released). The air-conditioning-on area is unchanged until the operating mode setting unit 211 shifts to the area determined state when the condition B is satisfied. During the area undetermined state, the operating mode setting unit 211 always detects the number of areas having the sound wave strength higher than the threshold X and, based on the detected number of areas, determines whether or not the condition B is satisfied.

As shown in FIG. 15, when the condition B is satisfied, the operating mode setting unit 211 shifts to an area determined state. In the area determined state, when the number N of areas having the sound wave strength higher than the threshold X is 1, the corresponding one area is determined as the air-conditioning-on area. When the number N of areas having the sound wave strength higher than the threshold X is 0, any area is not determined as the air-conditioning-on area (i.e., the air-conditioning-on area is not present). When the condition A is satisfied, the operating mode setting unit 211 shifts to the area determined state.

In this example, the operating mode setting unit 211 sets the air-conditioning operating mode for each area (step S222 in FIG. 10). When it is judged that the condition A is satisfied when the number N of areas having the sound wave strength higher than the threshold X has been larger than 1, the operating mode setting unit 211 shifts to the area undetermined state. When it is judged that the condition B is satisfied when the number N of areas having the sound wave strength higher than the threshold X has been equal to or smaller than 1.

Figure 18:
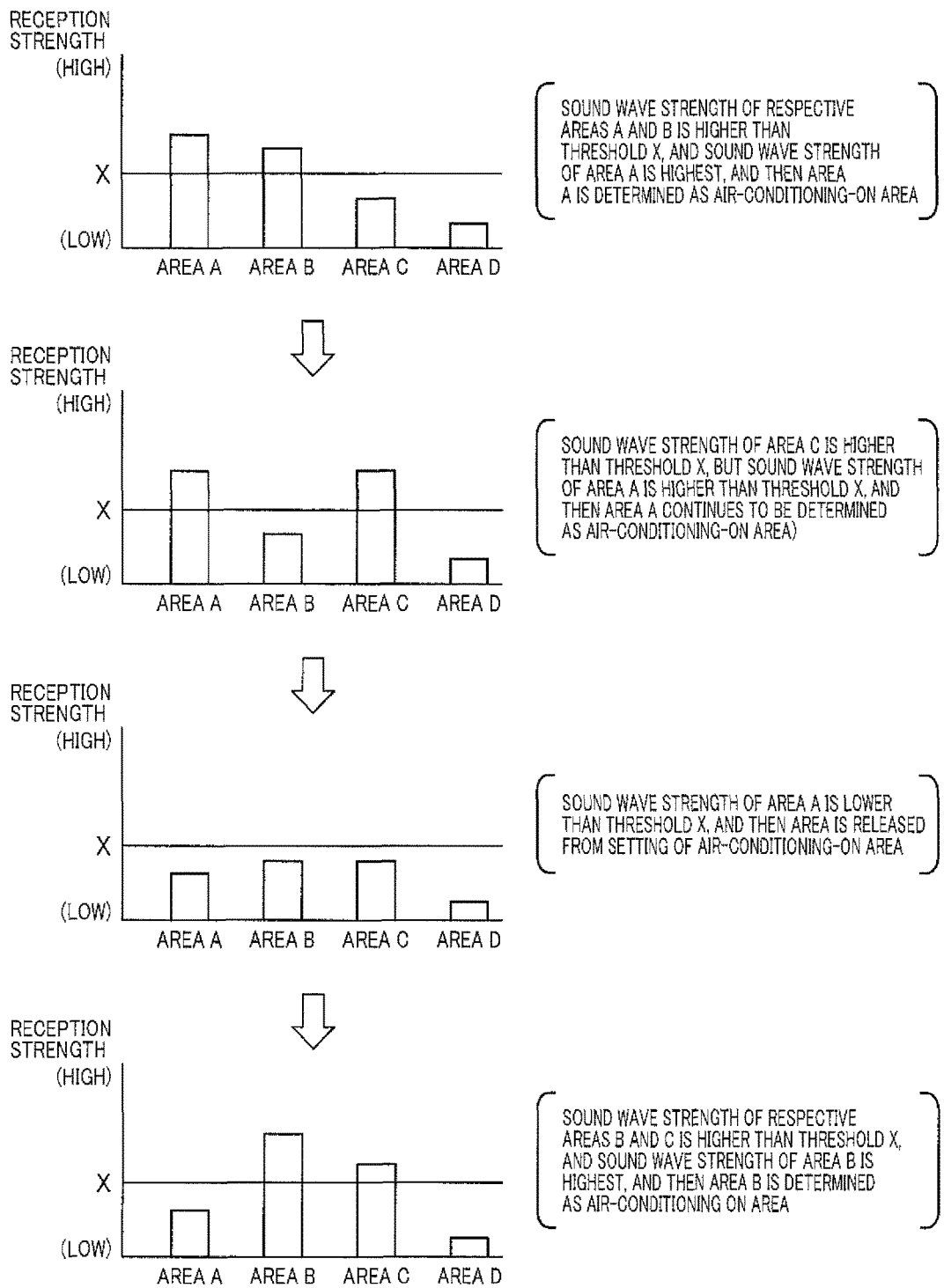
FIG. 18 is an explanatory diagram of an example of means for changing the air-conditioning-on area according to a seventh variation example.

For example, in FIG. 6 as described above, when two areas A and B of four areas A to D, have the sound wave strength higher than the threshold X, the operating mode setting unit 211 shifts to the area undetermined state. In this area undetermined state, as shown in FIG. 18, even when the sound wave strength of the area B has been changed to be equal to or lower than the threshold X and even when the sound wave strength of the area C has been changed to be higher than the threshold X, the air-conditioning-on area having the highest sound wave strength upon the start of the area undetermined state is determined as the air-conditioning-on area, and then, the area A continue to be determined the air-conditioning-on area (the area C is not determined as the air-conditioning-on area).

From this, even if the user is moving back and forth between the respective areas, the air-conditioning-on area does not vary one after another, until the movement area of the user has been settled to a certain degree.

C-7. Seventh Variation Example

In the above-described second embodiment, when at least a single piece of specific sound wave strength information indicating a sound wave strength that is the threshold X or higher is present among the pieces of sound wave strength information received from the auxiliary remote controllers 100, the main remote controller 200 sets the area in which the auxiliary remote controller 100 that is the transmission source of the specific sound wave strength information having the highest sound wave strength is set to normal operating mode, and sets the remaining areas to energy-saving operating mode.

In this case, if a user holding the mobile phone 400 is moving back and forth between the respective areas, an area that is determined as normal operating mode (hereinafter referred to as "air-conditioning-on area") may be vary one after another. To prevent this, the air-conditioning control system may include means for changing the air-conditioning-on area after the movement area of the user has been settled to a certain degree.

In this example, the operating mode setting unit 211 of the main remote controller 200 may set the air-conditioning operating mode for each area (step S22s in FIG. 10) in a manner that:

(i) when at least a single piece of specific sound wave strength information indicating a sound wave strength that is the threshold X or higher is present, an area having the highest sound wave strength (hereinafter referred to as "area HA") is determined as the air-conditioning-on area;

(ii) subsequently while the sound wave strength of the area HA has been equal to or higher than the threshold X, the area HA continues to be determined as the air-conditioning-on area; and (iii) subsequently, when the sound wave strength of the area HA has been changed to be lower than the threshold X, the area HA is released from the air-conditioning-on area.

For example, in FIG. 6 as described above, when two areas A and B of four areas A to D, have the sound wave strength higher than the threshold X and when the sound wave strength of the area A is the highest, the operating mode setting unit 211 determines the area A. Subsequently, as shown in FIG. 18, even when the sound wave strength of the area B has been changed to be lower than the threshold X and higher than the sound wave strength of the area A, while the sound wave strength of the area A has been equal to or higher than the threshold X, the area A continues to be determined as the air-conditioning-on area.

Subsequently, as shown in FIG. 18, when the sound wave strength of the area A has been changed to be lower than the threshold X, the area A is released from the air-conditioning-on area (the area C is not determined as the air-conditioning-on area).

Further, when the sound wave strength of the respective areas B and C have been changed to be higher than the threshold X and when the sound wave strength of the area B has been the highest, the area B is determined as the air-conditioning-on area.

From this, even if the user is moving back and forth between the respective areas, the air-conditioning-on area does not vary one after another, until the movement area of the user has been settled to a certain degree.

C-8. Eighth Variation Example

In the above-described embodiments, the air-conditioning control system 10 is configured to use sound waves (e.g., ultrasonic waves), but may be configured to use radio waves as substitute for the sound waves.

In this case, for example, the plurality of auxiliary remote controllers (auxiliary controllers) 100 each may include a receiving unit and a strength information transmitting unit. The receiving unit may receive radio waves that are outputted from a portable apparatus capable of outputting radio waves or an apparatus that is carried on a person (user) and is capable of outputting radio waves. The transmitting unit may transmit radio wave strength information to the main remote controller (main controller) 200. The radio wave strength information indicates sound wave reception strength.

The main remote controller 200 may include a storage unit and an operating mode setting unit. The storage unit may store therein a predetermined threshold for radio wave strength. The operating mode setting unit may set the normal operating mode (the first operating mode) for at least a single area in which the auxiliary remote controller 100 that is a transmission source for specific radio wave strength information is set. The specific radio wave strength information indicates a radio wave strength that is the threshold or higher. The operating mode setting unit may set the energy-saving operating mode (the second operating mode) for at least one of the remaining areas.

According to this, air-conditioning operating mode setting that takes into consideration whether or not a person is present in each area can be actualized without a human detecting sensor being set in each area. In addition, the radio wave reception strength at the auxiliary remote controller 100 set in an area can be expected to be a certain level or higher, as long as the portable apparatus or the apparatus carried on the user is positioned inside this area.

As a result, in this variation example, energy consumption by the central-type air-conditioning system can be effectively reduced without compromising the comfort of air-conditioning, while preventing complexity in system configuration.

C-9. Ninth Variation Example

The present disclosure is not limited to the above-described embodiments and variation examples. The present disclosure can be actualized by various configurations without departing from the spirit of the invention. For example, the technical features in the embodiments, examples, and variation examples corresponding to the technical features of each exemplary embodiment described in the summary can be exchanged or combined as appropriate to solve some or all of the above-described problems or to achieve some or all of the above-described effects. In addition, unless stated in the present specification as being an essential feature, the technical features can be omitted as appropriate.

What is claimed is:

1. An air-conditioning control system for controlling a central-type air-conditioning system capable of performing conditioning in a first operating mode and conditioning in a second operating mode having lower energy consumption than the first operating mode, for each of a plurality of areas of which at least a portion of boundaries is partitioned by an object, the air-conditioning control system comprising:
   a plurality of auxiliary controllers that are set in respective areas of the plurality of areas; and
   a main controller that is capable of communicating with each of the plurality of auxiliary controllers;
   each of the plurality of auxiliary controllers comprising:
      a sound wave receiving unit that receives sound waves that are outputted from a portable apparatus that is capable of outputting sound waves;
      a sound wave strength information transmitting unit that transmits sound wave strength information to the main controller, the sound wave strength information indicating sound wave reception strength; and
      a processor that receives a time synchronization command transmitted from the main controller and sets a time of a clock so as to be synchronized among the plurality of auxiliary controllers, based on the time synchronization command,
   the main controller comprising:
      a storage unit that stores therein a predetermined threshold;
      an operating mode setting unit that sets the first operating mode for at least a single area in which each of the auxiliary controllers that is a transmission source for specific sound wave strength information indicating a sound wave strength that is the threshold or higher is located, and sets the second operating mode for at least one of any remaining areas; and
      a processor that transmits the time synchronization command to each of the plurality of auxiliary controllers.

2. The air-conditioning control system according to claim 1, wherein
   the operating mode setting unit sets an air-conditioning operating mode to the first operating mode for all areas in which each of the auxiliary controllers that is the transmission source of the specific sound wave strength information is set, and sets the air-conditioning operating mode to the second operating mode for any remaining areas.

3. The air-conditioning control system according to claim 2, wherein:
   each of the auxiliary controllers repeatedly performs reception of the sound waves by the sound wave receiving unit and transmission of the sound wave strength information to the main controller by the sound wave strength information transmitting unit, at a common timing; and
   the operating mode setting unit repeatedly performs setting of the air-conditioning operating mode for each of the plurality of areas.

4. The air-conditioning control system according to claim 3, wherein:
   each of the auxiliary controllers includes a storage unit that stores therein an area identifier (ID) that identifies an area in which each of the auxiliary controllers is set; and
   the sound wave strength information transmitting unit transmits the sound wave strength information, together with the area ID, to the main controller.

5. The air-conditioning control system according to claim 4, wherein the portable apparatus is a mobile phone.

6. The air-conditioning control system according to claim 1, wherein:
   each of the auxiliary controllers repeatedly performs reception of the sound waves by the sound wave receiving unit and transmission of the sound wave strength information to the main controller by the sound wave strength information transmitting unit, at a common timing; and
   the operating mode setting unit repeatedly performs setting of the air-conditioning operating mode for each of the plurality of areas.

7. The air-conditioning control system according to claim 1, wherein:
   each of the auxiliary controllers includes a storage unit that stores therein an area identifier (ID) that identifies an area in which each of the auxiliary controllers is set; and
   the sound wave strength information transmitting unit transmits the sound wave strength information, together with the area ID, to the main controller.

8. The air-conditioning control system according to claim 1, wherein the portable apparatus is a mobile phone.

9. The air-conditioning control system according to claim 1, wherein the sound wave receiving unit receives the sound waves having a predetermined frequency and the sound waves are outputted at a predetermined timing from the portable apparatus that is capable of outputting sound waves.

10. An air-conditioning control system for controlling a central-type air-conditioning system capable of performing conditioning in a first operating mode and conditioning in a second operating mode having lower energy consumption than the first operating mode, for each of a plurality of areas of which at least a portion of boundaries is partitioned by an object, the air-conditioning control system comprising:
   a plurality of auxiliary controllers that are set in respective areas of the plurality of areas; and
   a main controller that is capable of communicating with each of the plurality of auxiliary controllers,
   each of the plurality of auxiliary controllers comprising:
      a sound wave receiving unit that receives sound waves that are outputted from an apparatus that is wearable and is capable of outputting sound waves; and
      a sound wave strength information transmitting unit that transmits sound wave strength information to the main controller, the sound wave strength information indicating sound wave reception strength; and
      a processor that receives a time synchronization command transmitted from the main controller and sets a time of a clock so as to be synchronized among the plurality of auxiliary controllers, based on the time synchronization command,
   the main controller comprising:
      a storage unit that stores therein a predetermined threshold;
      an operating mode setting unit that sets the first operating mode for at least a single area in which each of the auxiliary controllers that is a transmission source for specific sound wave strength information indicating a sound wave strength that is the threshold or higher is located, and sets the second operating mode for at least one of any remaining areas; and
      a processor that transmits the time synchronization command to each of the plurality of auxiliary controllers.

11. The air-conditioning control system according to claim 10, wherein the sound wave receiving unit receives the sound waves having a predetermined frequency and the sound waves are outputted at a predetermined timing from the apparatus that is wearable and that is capable of outputting sound waves.

* * * * *